(12) United States Patent
Nakano

(10) Patent No.: US 11,888,058 B2
(45) Date of Patent: *Jan. 30, 2024

(54) SEMICONDUCTOR DEVICE

(71) Applicant: ROHM CO., LTD., Kyoto (JP)

(72) Inventor: Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 98 days.

This patent is subject to a terminal disclaimer.

(21) Appl. No.: 17/229,415

(22) Filed: Apr. 13, 2021

(65) Prior Publication Data

US 2021/0234040 A1 Jul. 29, 2021

Related U.S. Application Data

(63) Continuation of application No. 16/547,007, filed on Aug. 21, 2019, now Pat. No. 11,004,968, which is a (Continued)

(30) Foreign Application Priority Data

Mar. 27, 2015 (JP) .................................. 2015-066694

(51) Int. Cl.
*H01L 29/78* (2006.01)
*H01L 29/06* (2006.01)
(Continued)

(52) U.S. Cl.
CPC .......... *H01L 29/7813* (2013.01); *H01L 29/06* (2013.01); *H01L 29/0615* (2013.01);
(Continued)

(58) Field of Classification Search
CPC . H01L 29/7813; H01L 29/06; H01L 29/0615; H01L 29/0619; H01L 29/0623;
(Continued)

(56) References Cited

U.S. PATENT DOCUMENTS 7,009,247 B2  3/2006 Darwish
7,067,879 B1  6/2006 Dyer et al.
(Continued)

FOREIGN PATENT DOCUMENTS

CN   1455459   11/2003
CN   104247028  12/2014
(Continued)

OTHER PUBLICATIONS

International Search Report for PCT/JP2016/053701, dated Apr. 26, 2016, 5 pages including English translation.

(Continued)

*Primary Examiner* — Shaun M Campbell
(74) *Attorney, Agent, or Firm* — XSENSUS LLP

(57) ABSTRACT

The semiconductor device of the present invention includes a semiconductor layer which includes an active portion and a gate finger portion, an MIS transistor which is formed at the active portion and includes a gate trench as well as a source region, a channel region and a drain region sequentially along a side surface of the gate trench, a plurality of first gate finger trenches arranged by an extended portion of the gate trench at the gate finger portion, a gate electrode embedded each in the gate trench and the first gate finger trench, a second conductive-type first bottom-portion impurity region formed at least at a bottom portion of the first gate finger trench, a gate finger which crosses the plurality of first gate finger trenches and is electrically connected to the gate electrode, and a second conductive-type electric field relaxation region which is formed more deeply than the bottom portion of the first gate finger trench between the mutually adjacent first gate finger trenches.

20 Claims, 19 Drawing Sheets

Related U.S. Application Data continuation of application No. 15/561,800, filed as application No. PCT/JP2016/053701 on Feb. 8, 2016, now Pat. No. 10,431,677.

(51) Int. Cl.
| | |
|---|---|
| *H01L 29/10* | (2006.01) |
| *H01L 29/417* | (2006.01) |
| *H01L 29/423* | (2006.01) |
| *H01L 29/12* | (2006.01) |
| *H01L 29/49* | (2006.01) |
| *H01L 29/16* | (2006.01) |
| *H01L 29/20* | (2006.01) |

(52) U.S. Cl.
CPC ...... *H01L 29/0619* (2013.01); *H01L 29/0623* (2013.01); *H01L 29/0653* (2013.01); *H01L 29/1095* (2013.01); *H01L 29/12* (2013.01); *H01L 29/41766* (2013.01); *H01L 29/4236* (2013.01); *H01L 29/4238* (2013.01); *H01L 29/4925* (2013.01); *H01L 29/7811* (2013.01); *H01L 29/0696* (2013.01); *H01L 29/1608* (2013.01); *H01L 29/2003* (2013.01); *H01L 29/42368* (2013.01)

(58) Field of Classification Search
CPC . H01L 29/0653; H01L 29/1095; H01L 29/12; H01L 29/41766; H01L 29/4236; H01L 29/4238; H01L 29/4925; H01L 29/7811; H01L 29/0696; H01L 29/1608; H01L 29/2003; H01L 29/42368
See application file for complete search history.

(56) References Cited

U.S. PATENT DOCUMENTS

| | | | | |
|---|---|---|---|---|
| 10,431,677 | B2* | 10/2019 | Nakano | H01L 29/0623 |
| 11,004,968 | B2* | 5/2021 | Nakano | H01L 29/0653 |
| 2004/0113201 | A1 | 6/2004 | Bhalla et al. | |
| 2007/0145514 | A1 | 6/2007 | Kocon | |
| 2008/0073710 | A1* | 3/2008 | Yamamoto | H01L 29/42376 257/334 |
| 2009/0206913 | A1 | 8/2009 | Zeng et al. | |
| 2011/0127606 | A1 | 6/2011 | Bobde et al. | |
| 2015/0214355 | A1* | 7/2015 | Nakano | H01L 29/7806 257/330 |
| 2015/0295079 | A1* | 10/2015 | Nakano | H01L 29/1095 257/330 |
| 2015/0325558 | A1 | 11/2015 | Hikasa | |
| 2015/0325691 | A1* | 11/2015 | Miyakoshi | H01L 29/7395 257/329 |
| 2016/0005827 | A1* | 1/2016 | Nakano | H01L 29/0657 257/77 |
| 2019/0259828 | A1 | 8/2019 | Nakano et al. | |

FOREIGN PATENT DOCUMENTS

| | | | |
|---|---|---|---|
| EP | 0801425 | 10/1997 | |
| JP | H11266014 | 9/1999 | |
| JP | 2000223705 | 8/2000 | |
| JP | 2003309263 | 10/2003 | |
| JP | 2006520091 | 8/2006 | |
| JP | 2008084901 | 4/2008 | |
| JP | 2011216847 | 10/2011 | |
| JP | 2012129446 | 7/2012 | |
| JP | 2013-69783 A | 4/2013 | |
| JP | 2013232533 | 11/2013 | |
| JP | 2014038988 | 2/2014 | |
| JP | 2014175314 | 9/2014 | |
| WO | WO-2014030589 A1 * | 2/2014 | ........... H01L 29/063 |
| WO | 2014136801 | 9/2014 | |
| WO | 2014136802 | 9/2014 | |
| WO | WO-2014136802 A1 * | 9/2014 | ........ H01L 29/0619 |
| WO | 2014163058 | 10/2014 | |

OTHER PUBLICATIONS

International Preliminary Report on Patentability for International Patent Application No. PCT/JP2016/053701, dated Oct. 12, 2017, 18 pages including English translation.

Extended European Search Report issued for European Patent Application No. 16771899.8, dated Oct. 15, 2018, 12 pages.

Office Action issued for Japanese Patent Application No. 2015-066694, Dispatch Date: Apr. 18, 2019, 10 pages Including English translation.

Office Action issued for Chinese Patent Application No. 201680019148.7, dated Mar. 25, 2020, 21 pages including English machine translation.

Japanese Office Action, issued in the Japanese patent application No. 2019-184663, dated Aug. 13, 2020, 10 pages including machine translation.

Chinese Office Action dated Jun. 13, 2023 in corresponding Chinese Patent Application No. 202110489242.1 (with machine-generated English translation), 15 pages.

Japanese Office Action dated Oct. 5, 2023 in corresponding Japanese Application No. 2022-170022 (with 1 machine-generated English translation), 7 pages.

Chinese Office Action dated Nov. 10, 2023 in corresponding Chinese Patent Application No. 202110489242.1 (with machine-generated English translation), 14 pages.

Japanese Office Action dated Dec. 7, 2023 in corresponding Japanese Patent Application No. 2023-195431 (with machine-generated English translation), 3 pages.

\* cited by examiner

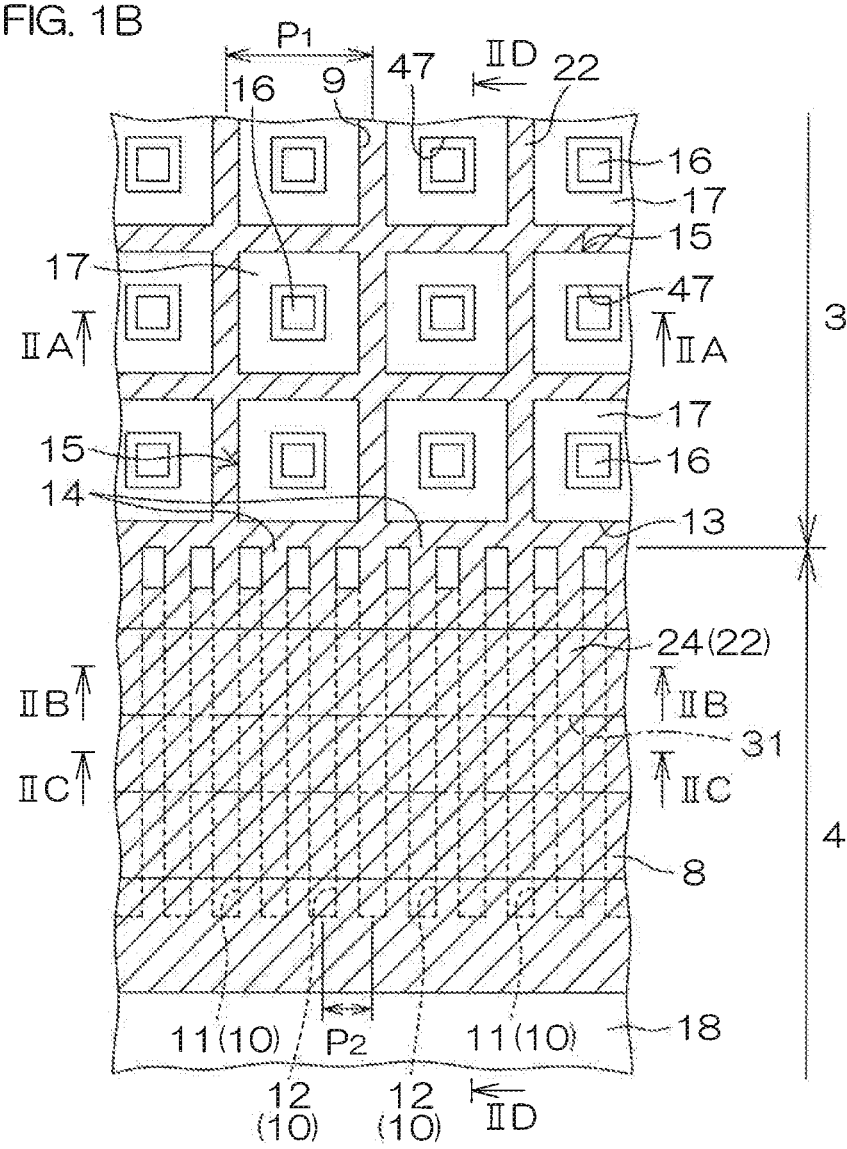

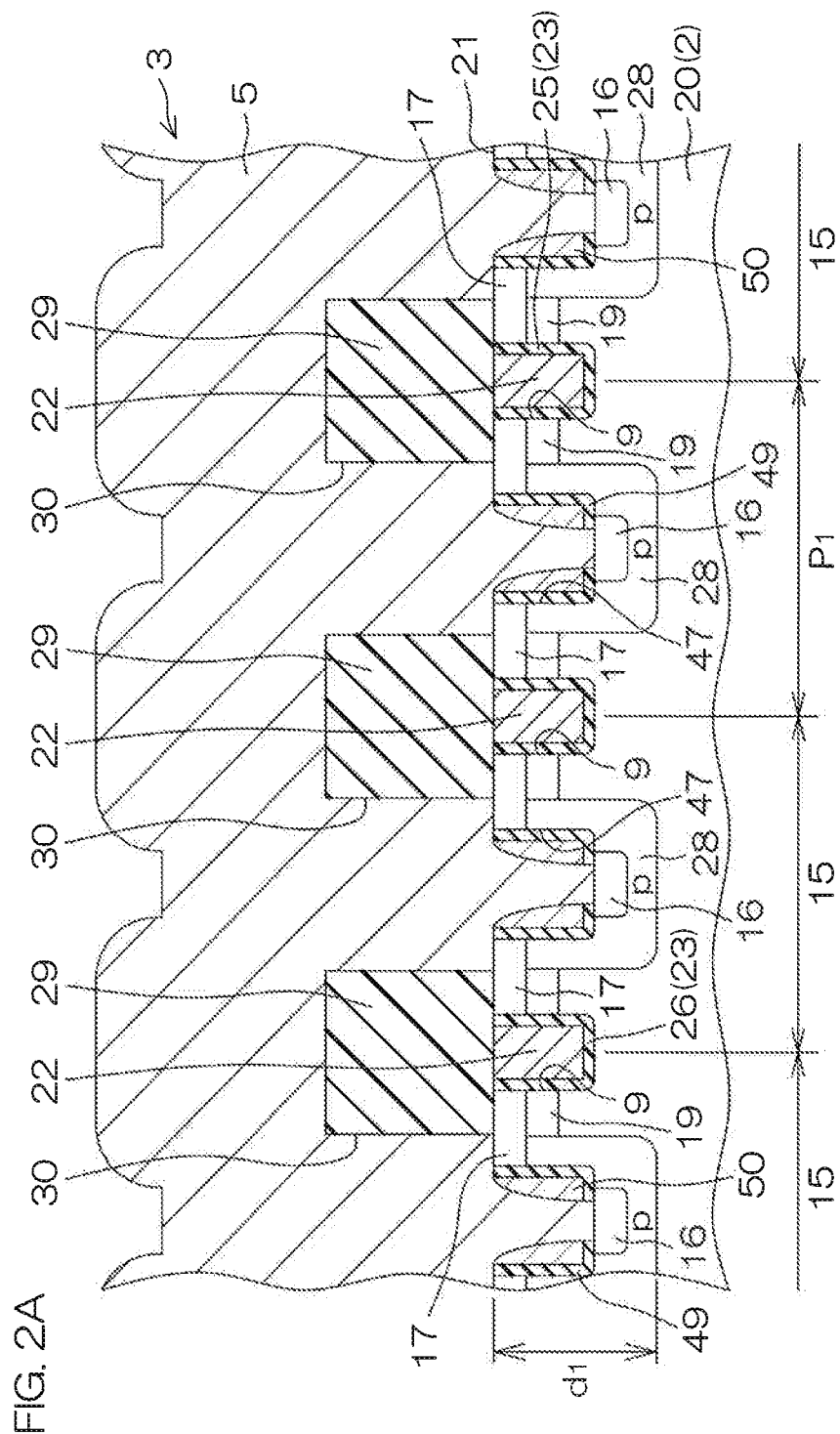

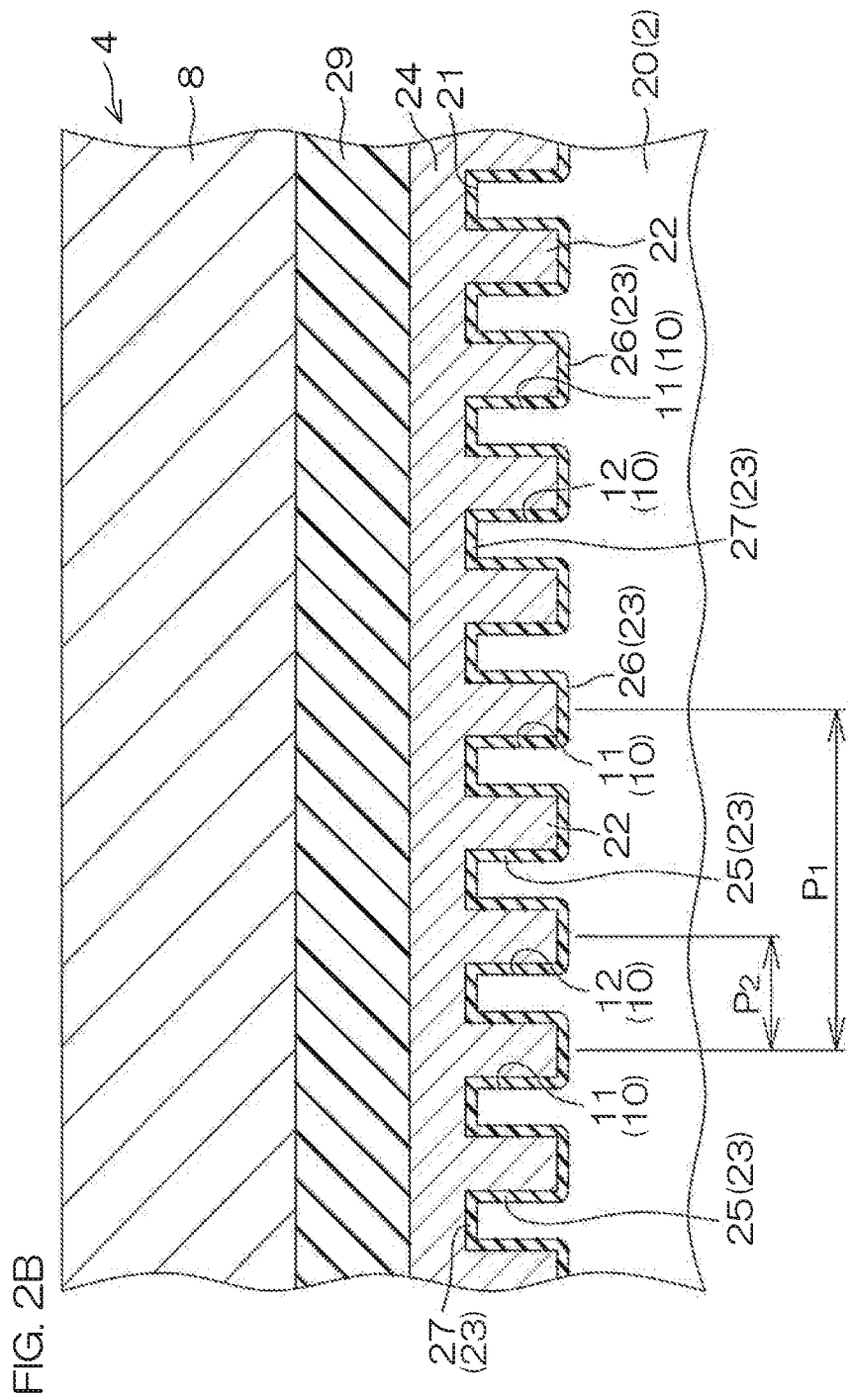

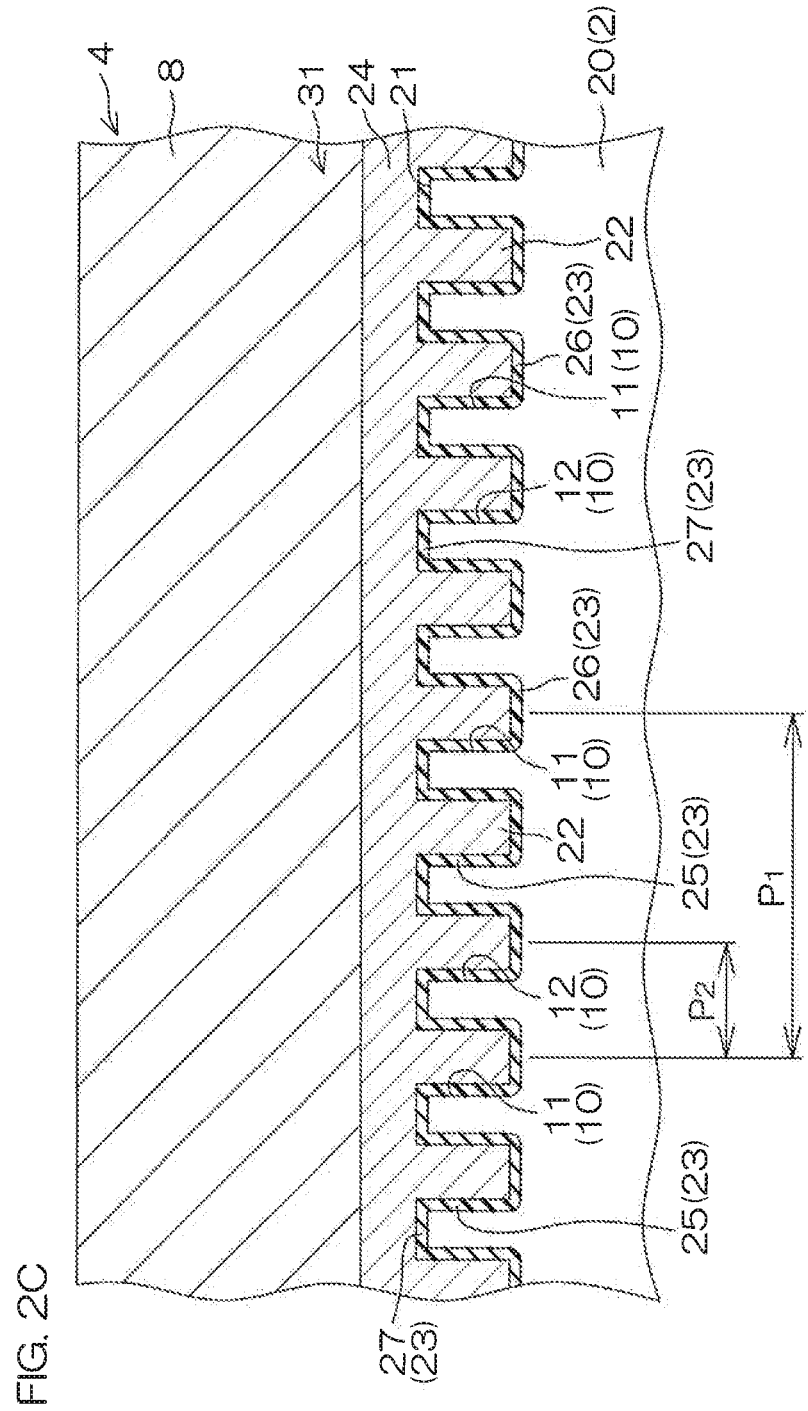

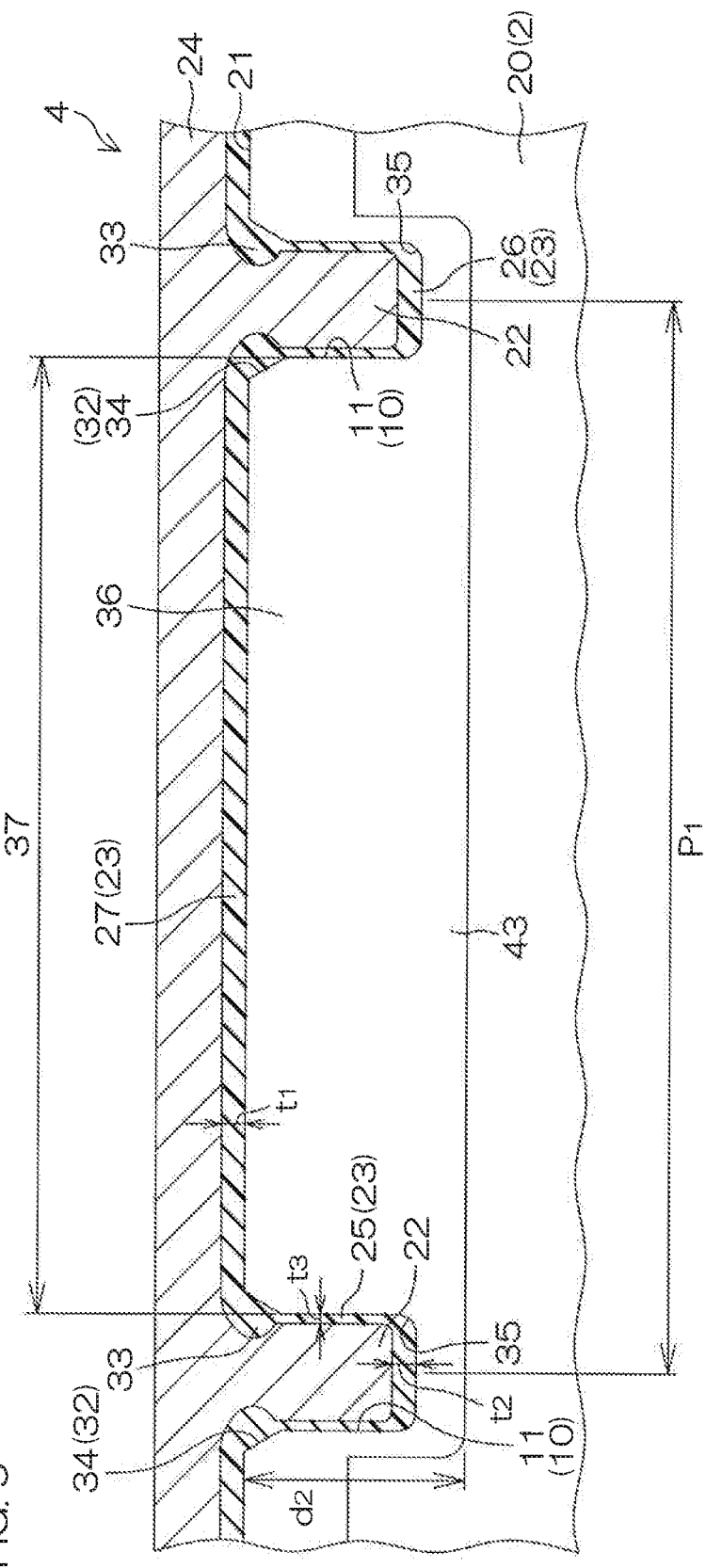

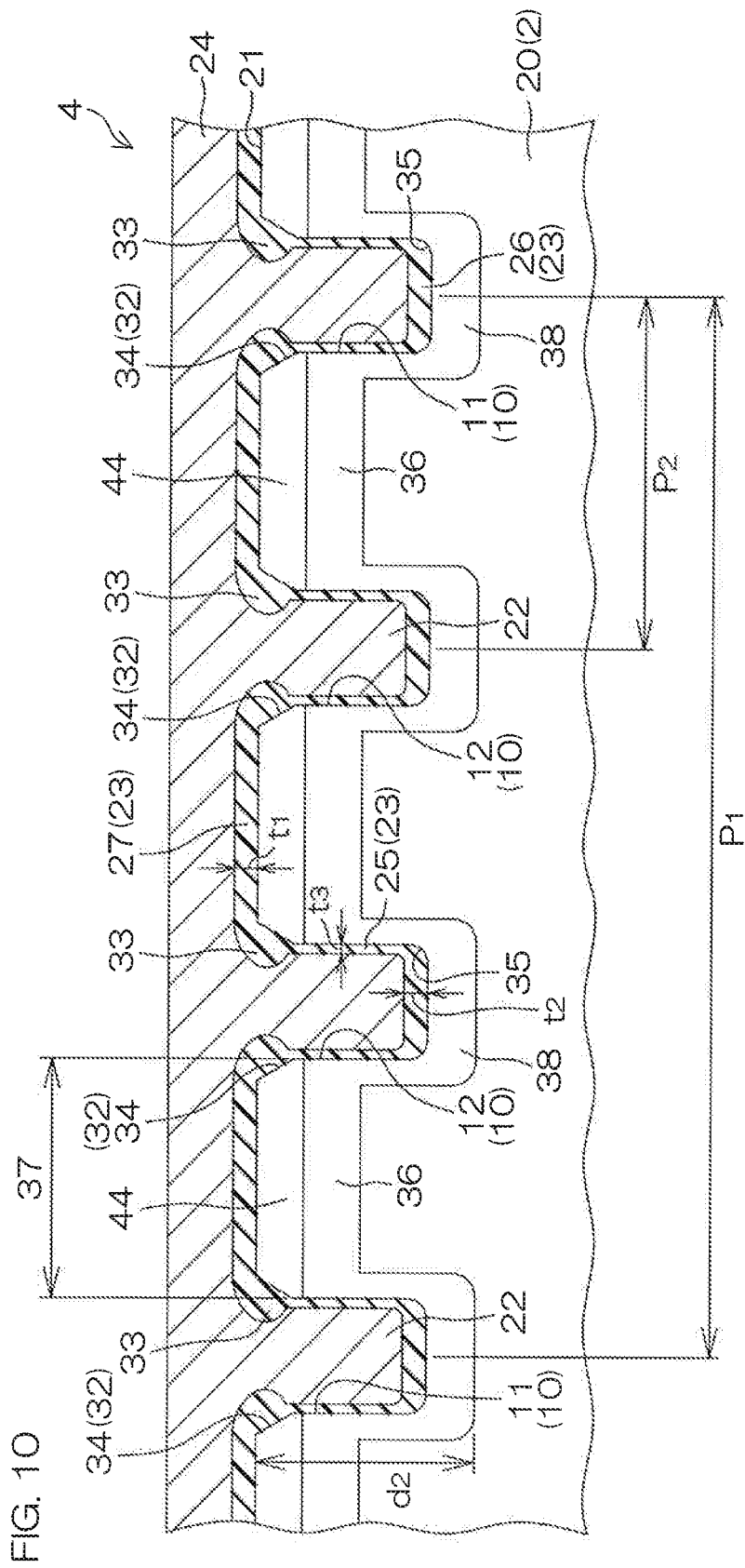

SEMICONDUCTOR DEVICE

TECHNICAL FIELD

The present invention relates to a semiconductor device which has a trench-gate structure.

BACKGROUND ART

For example, Patent Literature 1 discloses a trench-gate vertical MOSFET including an epitaxial layer formed thereon with an active cell array and a gate bus area, a gate trench formed in the active cell array, a gate oxide film formed in the gate trench, a gate electrode made of polysilicon embedded in the gate trench, a trench formed in the gate bus area and being connected to the gate trench, and a gate bus (gate finger) made of polysilicon embedded in the trench so that the surface of the epitaxial layer is covered in the gate bus area.

CITATION LIST

Patent Literature

Patent Literature 1: Japanese Translation of International Application (Translation of PCT Application) No. 2006-520091

SUMMARY OF INVENTION

Technical Problem

In order to obtain a high avalanche resistance in a transistor, it is necessary to cause avalanche breakdown by a pn junction of an active portion. That is, when an electric field is concentrated at a gate finger portion lower in breakdown resistance than an active portion at the time of avalanche breakdown (on application of high voltage), the gate finger portion is broken first, it is therefore difficult to obtain a sufficient avalanche resistance.

A preferred embodiment of the present invention provides a semiconductor device which has a trench-gate structure capable of obtaining a high avalanche resistance.

Solution to Problem

A preferred embodiment of the present invention provides a semiconductor device which includes a semiconductor layer which includes an active portion and a gate finger portion, an MIS transistor which is formed at the active portion and which includes a gate trench as well as a first conductive-type source region, a second conductive-type channel region, and a first conductive-type drain region sequentially along a side surface of the gate trench, a plurality of first gate finger trenches arranged by an extended portion of the gate trench at the gate finger portion, a gate electrode embedded each in the gate trench and the first gate finger trench via a gate insulating film, a second conductive-type first bottom-portion impurity region formed at least at a bottom portion of the first gate finger trench, a gate finger which crosses the plurality of first gate finger trenches and is electrically connected to the gate electrode, and a second conductive-type electric field relaxation region which is formed more deeply than the bottom portion of the first gate finger trench between the mutually adjacent first gate finger trenches.

According to this arrangement, it is possible to make narrower a pitch of a second conductive-type impurity region (a region including both the first bottom-portion impurity region and the electric field relaxation region) at the gate finger portion than a pitch of the gate trench by the presence of the electric field relaxation region. Thereby, since the second conductive-type impurity region can be increased in density at the gate finger portion, it is possible to alleviate electric field concentration at the gate finger portion on application of high voltage and reduce occurrence of avalanche breakdown at the gate finger portion. As a result, avalanche breakdown is allowed to preferentially occur at the active portion, therefore it is possible to realize a high avalanche resistance.

A preferred embodiment of the present invention additionally includes a second gate finger trench which is formed between the mutually adjacent first gate finger trenches and being integral with the gate trench, and the electric field relaxation region includes a second bottom-portion impurity region formed at least at a bottom portion of the second gate finger trench.

According to this arrangement, the depth of the second gate finger trench can be added to the depth of the electric field relaxation region. Therefore, it is possible to easily form an electric field relaxation region which is deeper than the bottom portion of the first gate finger trench only by forming an impurity region in a relatively shallow manner from the bottom portion of the second gate finger trench.

In a preferred embodiment of the present invention, the second gate finger trench may extend along the first gate finger trench or may extend in a direction intersecting with the first gate finger trench.

In a preferred embodiment of the present invention, a region between the mutually adjacent first gate finger trenches includes a flat region in which the surface of the semiconductor layer continues from one of the first gate finger trenches to the other of the first gate finger trenches, and the semiconductor device additionally includes a second conductive-type surface-portion impurity region which is formed more shallowly than the bottom portion of the first gate finger trench at the flat region. In this case, the electric field relaxation region may include a region which is formed so as to continue to the surface-portion impurity region or may include a region which is formed below the surface-portion impurity region, with a clearance kept.

For example, in a case where the electric field relaxation region is formed by ion implantation, the depth thereof is controlled by implanting energy. The greater the implanting energy increases, the deeper a position the electric field relaxation region can be formed from the surface of the semiconductor. The implanting energy is determined according to an intended depth position. Therefore, when a mask undergoes positional deviation at a stage prior to implantation, there is a case that no impurity region can be formed at the intended depth position. For example, in a case where an impurity region is formed at the bottom portion of a trench, energy conditions will be determined according to a depth from a reference surface, with an implantation surface (the bottom surface of the trench) given as the reference surface. However, if the mask deviates laterally in relation to the trench, the reference surface of the depth will move upward up to the surface of the semiconductor (an opening end of the trench), and there is a possibility that the impurity region may be formed only at a shallower position than the intended position.

According to the arrangement of this preferred embodiment, since the electric field relaxation region is formed at a flat region of the semiconductor layer, the reference surface of ion implantation is hardly changed in height position even on occurrence of positional deviation of the mask. Therefore, it is possible to form the electric field relaxation region at an intended depth position with a high probability.

In a preferred embodiment of the present invention, the MIS transistor additionally includes a second conductive-type region which continues to the channel region and is formed more deeply than the electric field relaxation region.

According to this arrangement, it is possible to further enhance an effect of alleviating electric field concentration at the gate finger portion on application of high voltage.

A preferred embodiment of the present invention provides a semiconductor device which includes a semiconductor layer that includes an active portion and a gate finger portion, an MIS transistor which is formed at the active portion and which includes a gate trench formed at a predetermined pitch $P_1$ as well as a first conductive-type source region, a second conductive-type channel region and a first conductive-type drain region sequentially along a side surface of the gate trench, a plurality of gate finger trenches which are formed at a pitch $P_2$ narrower than the pitch $P_1$ of the gate trench at the gate finger portion and being integral with the gate trench, a gate electrode embedded each in the gate trench and the gate finger trench via a gate insulating film, a second conductive-type bottom-portion impurity region which is formed at least at the bottom portion of the gate finger trench, and a gate finger which crosses the plurality of gate finger trenches and is electrically connected to the gate electrode.

According to this arrangement, the second conductive-type impurity region can be increased in density at the gate finger portion. Therefore, it is possible to alleviate electric field concentration at the gate finger portion on application of high voltage and reduce occurrence of avalanche breakdown at the gate finger portion. As a result, avalanche breakdown is allowed to preferentially occur at the active portion, therefore it is possible to realize a high avalanche resistance.

In a preferred embodiment of the present invention, the gate trench is formed in a lattice shape, and the gate finger trench includes a plurality of first gate finger trenches arranged by an extended portion of the gate trench and arrayed at a lattice pitch of the gate trench and a second gate finger trench formed between the mutually adjacent first gate finger trenches.

In a preferred embodiment of the present invention, the MIS transistor additionally includes a second conductive-type region which continues to the channel region and is formed more deeply than the bottom-portion impurity region.

According to this arrangement, it is possible to further enhance an effect of alleviating electric field concentration at the gate finger portion on application of high voltage.

In a preferred embodiment of the present invention, the bottom-portion impurity region is electrically connected to the channel region.

According to this arrangement, it is possible to maintain an electrical potential of the bottom-portion impurity region so as to be equal to an electrical potential of the channel region.

In a preferred embodiment of the present invention, the gate electrode is provided with an overlap portion overlapping a surface of the semiconductor layer at an upper edge of the trench in which the gate electrode is embedded, and the gate insulating film includes an overhung portion which protrudes inside the trench at the upper edge. The trench includes the gate trench, the gate finger trench, the first gate finger trench and the second gate finger trench.

According to this arrangement, the overhung portion is formed at the upper edge of the trench. Therefore, it is possible to improve withstand voltage of the gate insulating film at the upper edge. Thus, even if an electric field is concentrated at the upper edge when the gate is turned on, it is possible to prevent a dielectric breakdown of the gate insulating film at the upper edge. As a result, it is possible to improve the reliability in a gate-on voltage.

In a preferred embodiment of the present invention, the upper edge includes an inclined surface which allows the surface of the semiconductor layer to continue to an inner surface of the trench.

According to this arrangement, the electric field applied to the upper edge when the gate is turned on can be dispersed to the interior of the inclined surface, thereby alleviating electric field concentration.

In a preferred embodiment of the present invention, the upper edge includes a circular surface which allows the surface of the semiconductor layer to continue to the inner surface of the trench.

According to this arrangement, the electric field applied to the upper edge when the gate is turned on can be dispersed to the interior of the circular surface, thereby alleviating electric field concentration.

In a preferred embodiment of the present invention, the gate insulating film on the bottom surface of the trench is thicker than the gate insulating film on the side surface of the trench.

According to this arrangement, it is possible to reduce the capacitance of a capacitor arranged by the gate electrode and the semiconductor layer facing each other via the gate insulating film on the bottom surface of the trench. As a result, it is possible to reduce the capacity of the entire gate (gate capacitance). It is also possible to improve the withstand voltage of the gate insulating film on the bottom surface of the trench and therefore it is possible to prevent a dielectric breakdown of the gate insulating film when the gate is turned off.

In a preferred embodiment of the present invention, the gate insulating film additionally includes on the surface of the semiconductor layer a portion which is thicker than the gate insulating film on the side surface of the trench.

According to this arrangement, it is possible to reduce the capacitance of a capacitor arranged by the gate electrode (overlap portion) and the semiconductor layer facing each other via the gate insulating film on the surface of the semiconductor layer. As a result, it is possible to reduce the capacity of the entire gate (gate capacitance).

In a preferred embodiment of the present invention, a lower edge of the trench includes a circular surface which allows the side surface of the trench to continue to the bottom surface thereof.

According to this arrangement, the electric field applied to the lower edge when the gate is turned off can be dispersed to the interior of the circular surface, thereby alleviating electric field concentration.

In a preferred embodiment of the present invention, the semiconductor layer is composed of a wide band gap semiconductor.

In a preferred embodiment of the present invention, avalanche breakdown preferentially occurs at the active portion rather than the gate finger portion.

BRIEF DESCRIPTION OF DRAWINGS

FIG. 1B is an enlarged view of a region enclosed with a double dotted and dashed line IB in FIG. 1A.

FIG. 2A is a cross-sectional view of the semiconductor device (a cross-sectional view taken along line IIA-IIA in FIG. 1B).

FIG. 2B is cross-sectional view of the semiconductor device (a cross-sectional view taken along line IIB-IIB in FIG. 1B).

FIG. 2C is a cross-sectional view of the semiconductor device (a cross-sectional view taken along line IIC-IIC in FIG. 1B).

FIG. 9 is a cross-sectional view which describes a preferred embodiment of the gate finger portion of the semiconductor device.

FIG. 10 is a cross-sectional view which describes a preferred embodiment of the gate finger portion of the semiconductor device.

DESCRIPTION OF EMBODIMENTS

Preferred embodiments of the present invention will hereinafter be described in detail with reference to the accompanying drawings.

Figure 1A:
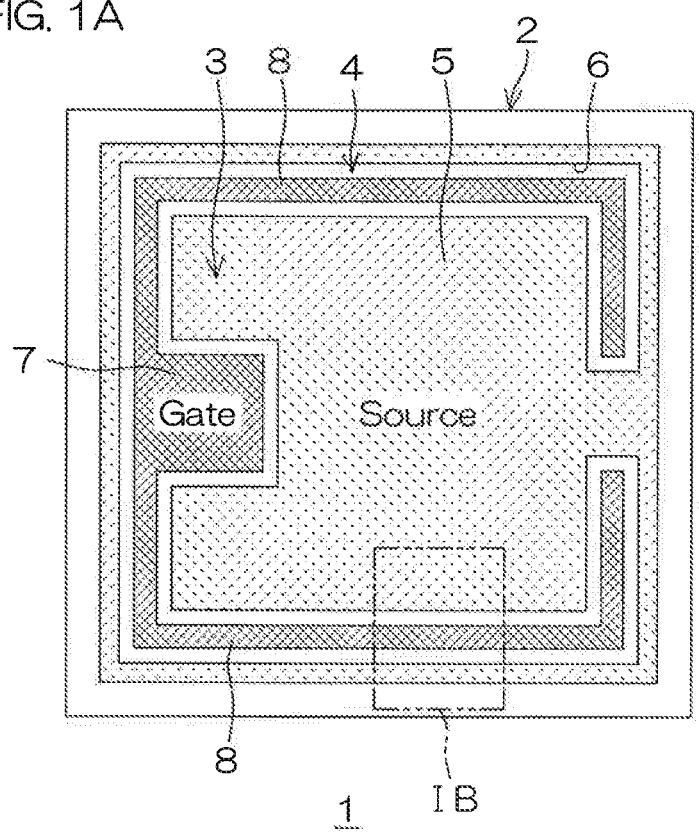
FIG. 1A is a schematic plan view of a semiconductor device according to a preferred embodiment of the present invention.

FIG. 1A is a schematic plan view of a semiconductor device 1 according to a preferred embodiment of the present invention. FIG. 1B is an enlarged view of a region enclosed with a double dotted and dashed line in FIG. 1A, The semiconductor device 1 includes a power MOSFET (Metal-Oxide-Semiconductor Field Effect Transistor) element (individual element) using SiC (silicon carbide) and has an up-down direction length of about 1 mm on the page of FIG. 1A, for example.

As shown in FIG. 1A, the semiconductor device 1 includes a SiC substrate 2 as one example of the semiconductor layer. The SiC substrate 2 may be a SiC epitaxial substrate which includes a base substrate and an active layer generated by epitaxial growth thereon. The SiC substrate 2 is arranged at a central portion thereof and provided with an active portion 3 that functions as a field effect transistor and a gate finger portion 4 that surrounds the active portion 3.

A source pad 5 made of aluminum, for example, is formed so as to cover a substantially entire region of the active portion 3. The source pad 5 is of substantially square shape in a plan view. At a circumferential edge portion of the source pad 5, a removal region 6 surrounding a central portion of the source pad 5 is formed along the gate finger portion 4. A portion of the removal region 6 is selectively recessed toward the central portion of the source pad 5. A gate pad 7 is disposed in the recess. A gate finger 8 made of aluminum, for example, extends over the entire removal region 6 from the gate pad 7 along the gate finger portion 4. A pair of gate fingers 8 are formed in a shape symmetrical to the gate pad 7.

As shown in FIG. 1B, directly below the source pad 5, etc., a gate trench 9 and a gate finger trench 10 are formed on the SiC substrate 2. The gate trench 9 is formed at the active portion 3. The gate trench 9 is formed in a lattice shape.

The gate finger trench 10 is formed at the gate finger portion 4. The gate finger trench 10 is formed integrally with the gate trench 9. Further, the gate finger trench 10 is formed at the same width as the gate trench 9. Since they are formed so as to be equal in width, it is possible to prevent a gate electrode 22 (described later) from an embedding failure.

The gate finger trench 10 includes a first gate finger trench 11 and a second gate finger trench 12. The first gate finger trench 11 is arranged by an extended portion of the gate trench 9 and formed in a stripe shape which is pulled from an each end portion of the gate trench 9 to the gate finger portion 4. That is, the first gate finger trench 11 is arrayed at the same pitch as a lattice pitch $P_1$ of the gate trench 9. The plurality of second gate finger trenches 12 are each formed at a region between the mutually adjacent first gate finger trenches 11. The second gate finger trench 12 is connected to a portion 14 between the respective end portions of transverse trenches 13 across a plurality of end portions of the gate trenches 9. In FIG. 1B, two of the second gate finger trenches 12 are installed at each portion 14 between the end portions, with no particular limitation given to the number. Further, in this preferred embodiment, each of the second gate finger trenches 12 is parallel to the first gate finger trench 11. The gate finger trenches 10, each of which is composed of a first gate finger trench 11 and a second gate finger trench 12, are arrayed at a pitch $P_2$ narrower than the lattice pitch $P_1$ in the gate finger portion 4.

It is noted that patterns of the gate trench 9 and the gate finger trench 10 are not limited to these shapes. For example, the gate trench 9 may have a stripe shape and a honeycomb shape, etc. The gate finger trench 10 may have a lattice shape and a honeycomb shape, etc.

The active portion 3 is partitioned by the gate trenches 9 into a larger number of unit cells 15. In the active portion 3, a large number of the unit cells 15 are to be arrayed regularly in a matrix. A source trench 47 is formed at a central portion of each unit cell 15. On a bottom surface of the source trench 47, a $p^+$ type channel contact region 16 (for example, concentrations of $1\times10^{18}$ cm$^{-3}$ to $5\times10^{21}$ cm$^{-3}$) is formed at a central region thereof, and an n$^+$ type source region 17 (for example, concentrations of $1\times10^{18}$ cm$^{-3}$ to $5\times10^{21}$ cm$^3$) is formed so as to surround the p$^+$ type channel contact region 16 (source trench 47). The n$^+$ type source region 17 forms a side surface of each unit cell 15 (a side surface of the gate trench 9) and a side surface of the source trench 47.

In the gate finger portion 4, the gate finger 8 is laid along a direction to cross the stripe-shaped gate finger trench 10. In this preferred embodiment, the gate finger 8 is laid in a region further inside than a longitudinal direction terminal end portion (an end portion on the opposite side of the gate trench 9) of the gate finger trench 10, and the terminal end portion of the gate finger trench 10 protrudes further outward than the gate finger 8. On the SiC substrate 2 in a region further outside than the terminal end portion, there is formed a lower step portion 18 which is dug down across an entire circumference of the gate finger portion 4. A p type guard ring, etc., (not shown) may be formed at the lower step portion 18.

Next, a basic cross-sectional structure of the active portion 3 and the gate finger portion 4 of the semiconductor device 1 will be described.

FIG. 2A, FIG. 2B, FIG. 2C and FIG. 2D are respectively cross-sectional views of the semiconductor device 1 (the cross-sectional view taken along line IIA-IIA, the cross-sectional view taken along line IIB-IIB, the cross-sectional view taken along line IIC-IIC and the cross-sectional view taken along line IID-IID in FIG. 1B).

As described above, the semiconductor device 1 is provided with the SiC substrate 2. In this preferred embodiment, the SiC substrate 2 is an n type SiC substrate. A portion further below than the surface portion of the SiC substrate 2 functions as an n type drain region 20 of a field effect transistor (for example, concentrations of $1\times10^{14}$ cm$^{-3}$ to $1\times10^{17}$ cm$^{-3}$).

Further, on a surface 21 side of the SiC substrate 2, there are formed the gate trenches 9 and the gate finger trenches 10. As described above, the active portion 3 is partitioned by the gate trenches 9 into a larger number of the unit cells 15. On an upper surface of each unit cell 15, an n$^+$ type source region 17 is formed, and at a lower portion thereof, a p type channel region 19 (for example, concentrations of $1\times10^{16}$ cm$^{-3}$ to $1\times10^{19}$ cm$^{-3}$) is formed. That is, as shown in FIG. 2A, the gate trench 9 penetrates through the n$^+$ type source region 17 and the p type channel region 19 to reach the n type drain region 20.

The gate electrode 22 made of polysilicon, for example, are embedded in the gate trench 9 and the gate finger trench 10 together. A gate insulating film 23 is interposed between the gate electrode 22 and the SiC substrate 2.

The gate electrode 22 is embedded in the gate trench 9 up to the surface 21 of the SiC substrate 2 in the active portion 3 as shown by an oblique hatching in FIG. 1B, for example. Thereby, the gate electrode 22 is also formed in a lattice shape, and an upper surface of each unit cell 15 is exposed without being covered with the gate electrode 22. On the other hand, the gate finger portion 4 is provided with an overlap portion 24 which is formed so as to cover the surface 21 of the SiC substrate 2 from an opening end of the gate finger trench 10. The overlap portion 24 is formed so as to cross the stripe-shaped gate finger trench 10 along the gate finger 8.

The gate insulating film 23 integrally includes a side surface portion 25 on the side surface of the gate trench 9, a bottom surface portion 26 on the bottom surface and a surface portion 27 on the surface 21 of the SiC substrate 2. The surface portion 27 is interposed at least between the overlap portion 24 and the surface 21 of the SiC substrate 2.

In the active portion 3, the gate electrode 22 crosses over the n$^+$ type source region 17 and the n type drain region 20, thereby controlling the formation of an inversion layer (channel) on the surface of the p type channel region 19 (a side surface of the gate trench 9). That is, the semiconductor device 1 is provided with a so-called trench gate type structured MOSFET.

The source trench 47 is formed at a central portion of each unit cell 15. The source trench 47 has the same depth as that of the gate trench 9 but has a width greater than that of the gate trench 9. The source trench 47 penetrates through the n$^+$ type source region 17 and the p type channel region 19. The source trench 47 may be formed in such a shape that is partitioned only by an outer circumference side in a plan view, as shown in FIG. 1B. In this case, as shown in FIG. 2A, one source trench 47 appears (a first pattern of the source trench) on a cut plane which is obtained when the SiC substrate 2 is cut in a depth direction thereof. Specifically, as shown in FIG. 1B, it may be formed in a (regular) quadrilateral shape, a (regular) hexagonal shape, a circle, etc., in a plan view.

An insulating film residue 49 and an electrode film residue 50 remain at a lower portion of the source trench 47. The insulating film residue 49 is selectively present at and around a corner portion of the source trench 47 so that a central portion of the bottom surface of the source trench 47 is exposed. The electrode film residue 50 is present only on the insulating film residue 49. That is, planar patterns of the insulating film residue 49 and the electrode film residue 50 match each other.

Further, in the active portion 3, a p type region 28 (for example, concentrations of $1\times10^{16}$ cm$^{-3}$ to $1\times10^{19}$ cm$^{-3}$) is formed at the n type drain region 20. The p type region 28 is formed along an inner surface of the source trench 47. The p type region 28 is provided with an external surface which extends in a vertical direction from the p type channel region 19 along a side surface of the source trench 47 and further extends in a lateral direction along the bottom surface of the source trench 47. A vertical external surface of the p type region 28 is arranged from the gate trench 9 to the interior thereof, with a clearance kept. Therefore, the n type drain region 20 and the p type channel region 19 which is connected to the p type region 28 are present at an intermediate region between the external surface and the gate trench 9. The p type region 28 is formed so as to continue to the p type channel region 19 and extends toward a rear surface of the SiC substrate 2 down to a position $d_1$ deeper than the p type channel region 19 in the n type drain region 20.

The p$^+$ type channel contact region 16 is selectively formed at a central portion on the bottom surface of the source trench 47. Further, the p$^+$ type channel contact region 16 is formed at such a dimension that covers across the interior and exterior of the insulating film residue 49. The thickness of the p$^+$ type channel contact region 16 (vertical direction depth from the bottom surface of the source trench 47) is smaller than that of the p type region 28. Therefore, the p$^+$ type channel contact region 16 is formed in a state of floating at the surface portion of the p type region 28.

On the surface 21 of the SiC substrate 2, an interlayer film 29 made of silicon oxide, for example, is formed. In the interlayer film 29, in the active portion 3, a contact hole 30 is selectively formed in the central region of the p type channel region 19. The contact hole 30 selectively exposes the source trench 47. Further, on the interlayer film 29, a contact hole 31 is selectively formed directly below the gate finger 8 at the gate finger portion 4. The contact hole 31 is formed linearly to surround the active portion 3 along the gate finger portion 4 in the width-direction center of the gate finger 8.

On the interlayer film 29, the source pad 5 and the gate finger 8 (gate pad 7) are formed. The source pad 5 collectively enters into all the contact holes 30 and is connected to the n+ type source region 17 and the p+ type channel contact region 16 in each unit cell 15. Therefore, the n+ type source region 17 is equipotential with the source pad 5. Further, the p type channel region 19 is connected via the p+ type channel contact region 16 to the source pad 5 and, thus, equipotential with the source pad 5. The gate finger 8 enters into the contact hole 31 and is connected to the overlap portion 24 of the gate electrode 22. Therefore, the gate electrode 22 embedded in the gate trench 9 is connected via the overlap portion 24 to the gate finger 8 and, thus, equipotential with the gate finger 8 (gate pad 7).

Figure 2D:
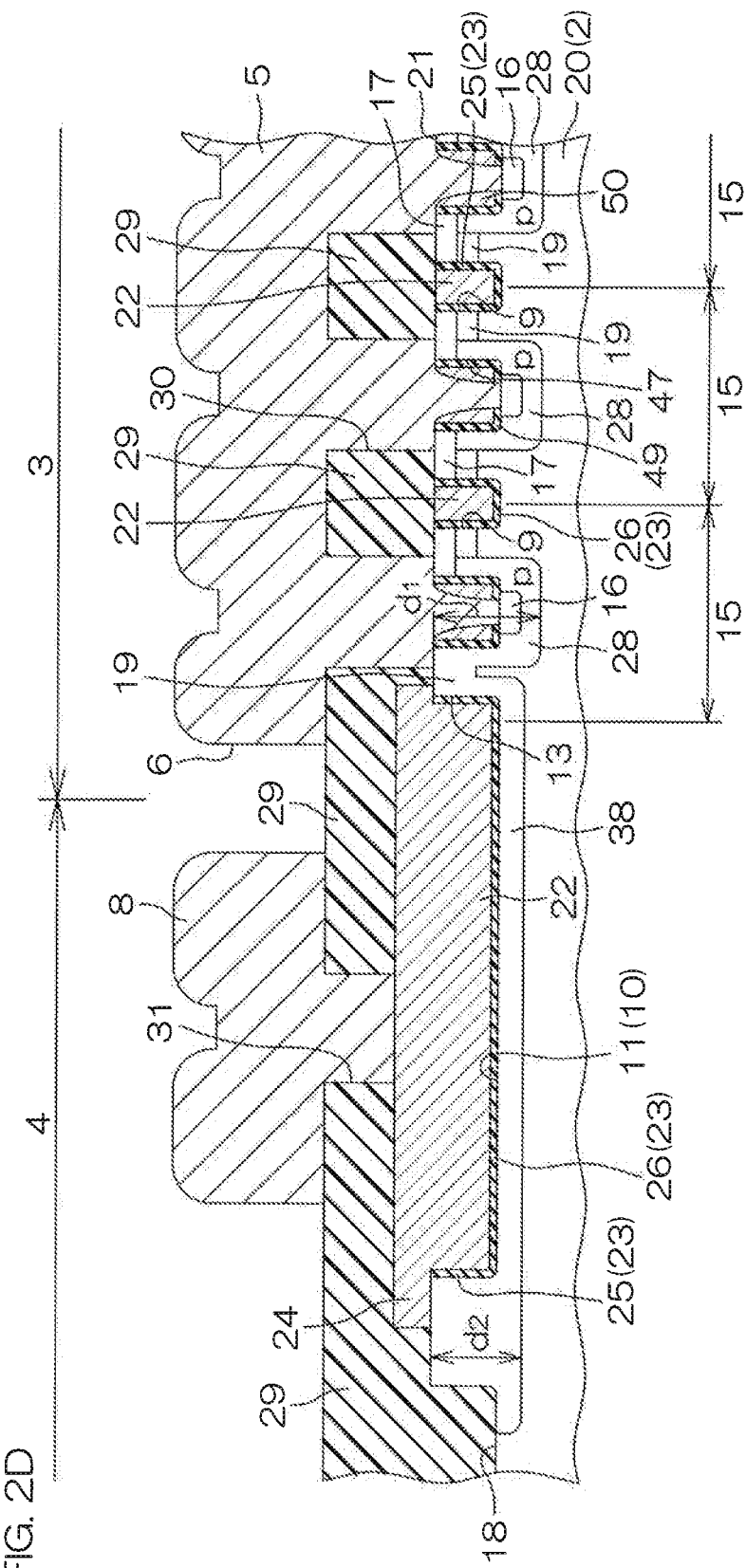
FIG. 2D is a cross-sectional view of the semiconductor device (a cross-sectional view taken along line IID-IID in FIG. 1B).
Figure 3:
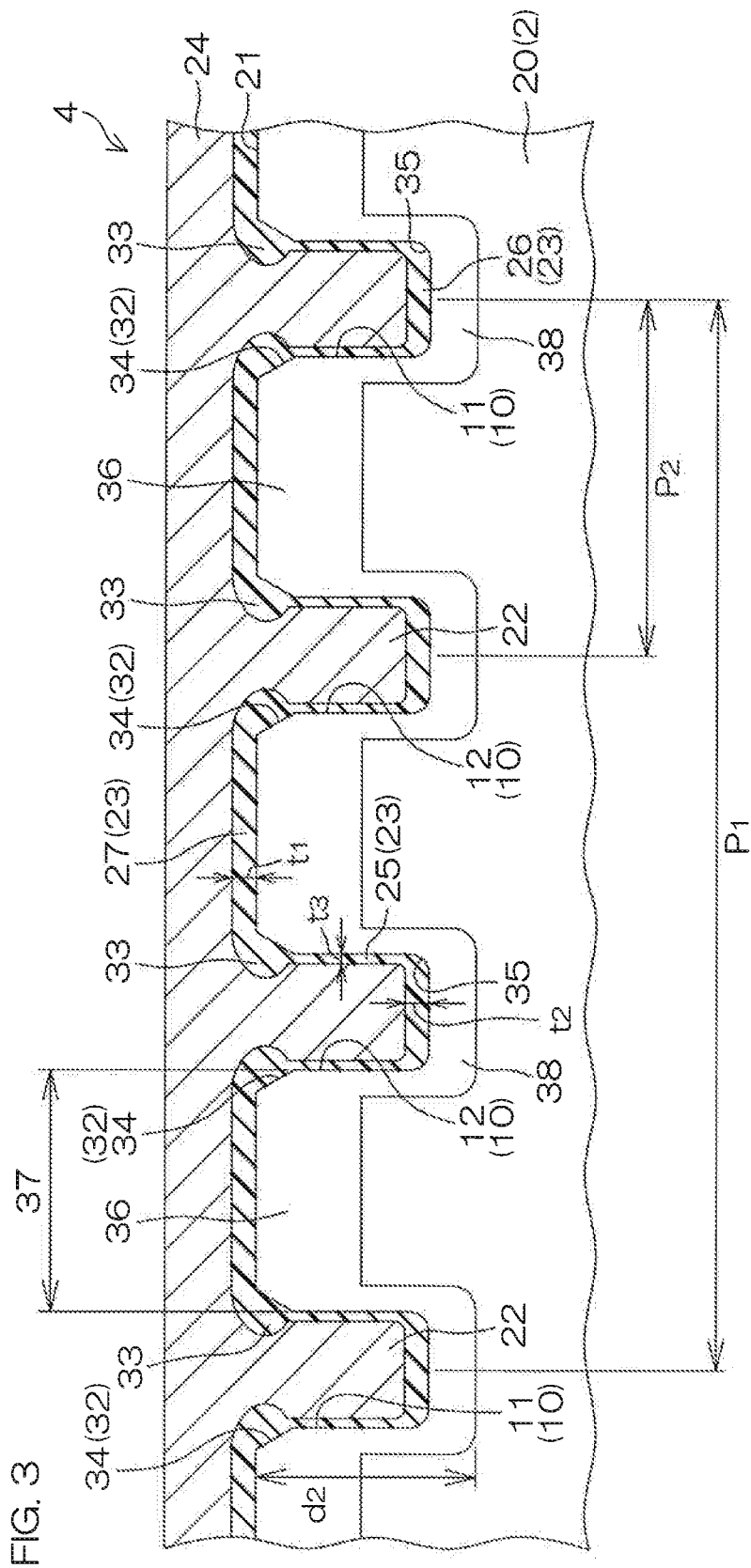
FIG. 3 is an enlarged cross-sectional view of a gate finger portion of the semiconductor device.

FIG. 3 is an enlarged cross-sectional view which shows the gate finger portion 4 of the semiconductor device 1. In FIG. 3, portions corresponding to those shown in FIG. 1A, FIG. 1B and FIG. 2 described above are indicated by being given the same reference symbols. Further, the gate finger 8 and the interlayer film 29 are omitted in FIG. 3.

The side surface portion 25 of the gate insulating film 23 includes an overhung portion 33 which is selectively made thicker than other portions of the side surface portion 25 so as to protrude inside the gate finger trench 10 at an upper edge 32 of the gate finger trench 10. The overhung portion 33 may be adopted at an upper edge (not shown) of the gate trench 9.

The upper edge 32 is a corner portion which includes an intersection line between a side surface of the gate finger trench 10 and the surface 21 of the SiC substrate 2. In FIG. 3, the upper edge 32 is given as an inclined surface 34 which allows the surface 21 of the SiC substrate 2 to continue to the side surface of the gate finger trench 10. That is, the upper edge 32 of the gate finger trench 10 is formed in a chamfered shape. It is noted that in place of the inclined surface 34, a circular surface 39 (refer to FIG. 6) may be adopted. The upper edge 32 of the gate finger trench 10 is not pointed but made round by the circular surface 39.

In the semiconductor device 1, when an on-voltage is applied to the gate finger 8, the on-voltage is also thereby applied to the overlap portion 24 of the gate electrode 22. Thus, it is likely that an electric field generated from the overlap portion 24 concentrates at the upper edge 32 of the gate finger trench 10. As a result, at the upper edge 32 of the gate finger trench 10, the gate insulating film 23 may have dielectric breakdown. However, the overhung portion 33 makes it possible to improve a withstand voltage of the gate insulating film 23 at the upper edge 32. Therefore, even if the electric field concentrates at the upper edge 32 when the gate is turned on, it is possible to prevent the gate insulating film 23 from having dielectric breakdown at the upper edge 32. As a result, it is possible to improve the reliability thereof on occurrence of gate-on voltage.

With regard to a relationship of thickness between various portions of the gate insulating film 23, it is preferable that the thickness $t_2$ of the bottom surface portion 26 is equal to or greater than the thickness $t_1$ of the surface portion 27 ($t_2 \geq t_1$) and each thickness, $t_1$, $t_2$, is greater than the thickness $t_3$ of the side surface portion 25 (excluding the overhung portion 33). That is, a relationship of $t_2 \geq t_1 > t_3$ is met. This arrangement makes it possible to reduce capacitance of a capacitor arranged by the gate electrode 22 and the SiC substrate 2 which face each other via the bottom surface portion 26. As a result, it is possible to reduce the capacity of the entire gate (gate capacitance). Since the bottom surface portion 26 can also be improved in withstand voltage, it is also possible to prevent the bottom surface portion 26 from having a dielectric breakdown when the gate is turned off. A surface portion 27 is also great in thickness and it is, thereby, possible to reduce capacitance of a capacitor arranged by the gate electrode 22 (overlap portion 24) and SiC substrate 2 which face each other via the surface portion 27. As a result, it is possible to reduce the capacity of the entire gate (gate capacitance).

The lower edge of the bottom portion of the gate finger trench 10 is a circular surface 35 which allows the side surface of the gate finger trench 10 to continue to the bottom surface thereof. That is, the lower edge of the gate finger trench 10 is not pointed but made round by the circular surface 35. This arrangement makes it possible to disperse an electric field applied to the lower edge when the gate is turned off to the interior of the circular surface 35, thereby alleviating electric field concentration at the lower edge.

Further, on a surface 21 side of the SiC substrate 2, a p type region 36 (for example, concentrations of $1 \times 10^{16}$ cm$^{-3}$ to $1 \times 10^{19}$ cm$^{-3}$) is formed as one example of the surface-portion impurity region. The p type region 36 is formed all over an entire region 37 between the mutually adjacent gate finger trenches 10 (a flat region in which the surface 21 of the SiC substrate 2 continues from one of the gate finger trenches 10 to the other of the gate finger trenches 10). The p type region 36 is formed more shallowly than the gate finger trench 10 and formed to be equal in depth to the p type channel region 19 of the active portion 3, for example (refer to FIG. 2A).

Further, at the bottom portion of the gate finger trench 10, a bottom portion p type region 38 (for example, concentrations of $1 \times 10^{16}$ cm$^{-3}$ to $1 \times 10^{19}$ cm$^{-3}$) is formed as one example of the electric field relaxation region. The bottom portion p type region 38 continues to the p type region 36. Specifically, the bottom portion p type region 38 is formed on the bottom surface and a side surface of the gate finger trench 10 so that the n type drain region 20 which is exposed to the gate finger trench 10 below the p type region 36 is hidden and continues to the p type region 36 at the upper end portion thereof. Therefore, with regard to a width direction of the gate finger trench 10, the plurality of bottom portion p type regions 38 and the plurality of p type regions 36 are formed alternatively so as to continue. On the other hand, with regard to a longitudinal direction of the gate finger trench 10, as shown in FIG. 2D, the bottom portion p type region 38 crosses a border portion between the gate finger trench 10 and the lower step portion 18 at the leading end side of the gate finger trench 10 and reaches the lower step portion 18. On the other hand, at the base end side of the gate finger trench 10 (on the side of the gate trench 9), the bottom portion p type region 38 is also formed at the bottom portion of the transverse trench 13 and further, is integrally formed with the p type channel region 19 at a side portion of the transverse trench 13. Thereby, the bottom portion p type region 38 is electrically connected to the p type channel region 19. As a matter of course, the p type region 36 is also electrically connected to the p type channel region 19 via the bottom portion p type region 38. Further, it is preferable that the depth $d_2$ of the bottom portion p type region 38 is equal to or smaller than the depth $d_1$ ($d_1 \geq d_2$) at the deepest portion of a p type impurity region in the active portion 3 (in this preferred embodiment, the bottom portion of the p type region 28). A dimensional relationship between the depths $d_1$ and $d_2$ is retained, thus making it possible to further enhance an effect of alleviating electric field concentration at the gate finger portion 4 on application of high voltage.

Figure 4:
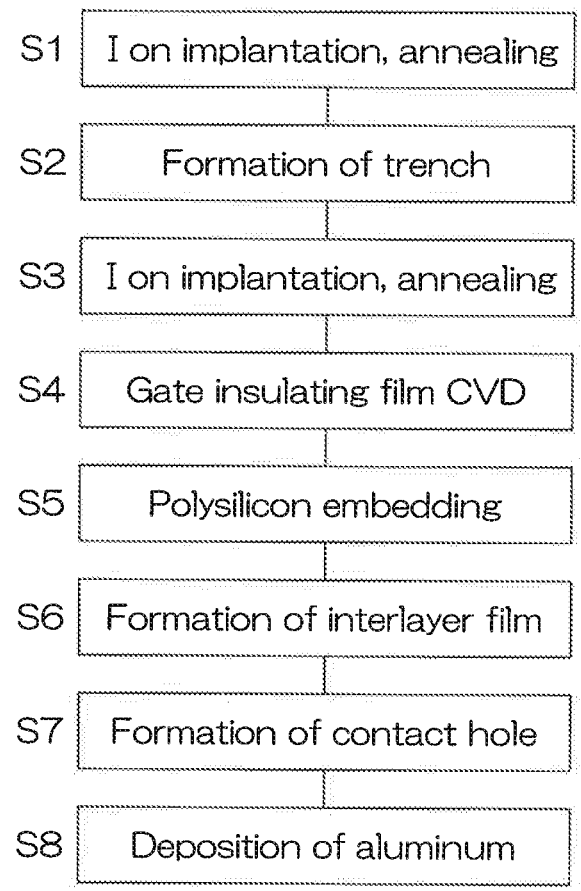
FIG. 4 is a flow chart which describes a method of manufacturing the semiconductor device.

FIG. 4 is a flow chart which describes a method of manufacturing the semiconductor device 1.

When the semiconductor device 1 is manufactured, an impurity is selectively implanted in the surface 21 of the SiC substrate 2, for example, to perform annealing treatment (Step S1). Thus, impurity regions such as the p type channel region 19, the $n^+$ type source region 17 and the $p^+$ type channel contact region 16 are formed. Next, the SiC substrate 2 is etched from the surface 21 with a predetermined pattern, by which the gate trench 9, the gate finger trench 10 and the source trench 47 are formed at the same time on the SiC substrate 2 (Step S2).

A next step is to form the p type region 28 and the bottom portion p type region 38. The p type region 28 and the bottom portion p type region 38 are formed by ion implantation and annealing treatment (Step S3). A mask which covers a region other than that in which the p type region 28 and the bottom portion p type region 38 are to be formed is formed on the SiC substrate 2, and a p type impurity (ion) is implanted via the mask. The bottom portion p type region 38 is formed by the p type impurity implanted in the side surface and the bottom surface of the gate finger trench 10 and subjected to annealing treatment after implantation.

A next step is to form the gate insulating film 23 (Step S4). When the gate insulating film 23 is formed, a CVD method is used under predetermined conditions (a gas flow rate, type of gas, gas ratio, gas supply time, etc.) to deposit an insulating material inside the gate trench 9 and the gate finger trench 10 so that the overhung portion 33 selectively made thicker than other portions is formed at the upper edge 32 of the gate finger trench 10. Thereby, there is formed the gate insulating film 23 having the overhung portion 33.

Figure 5:
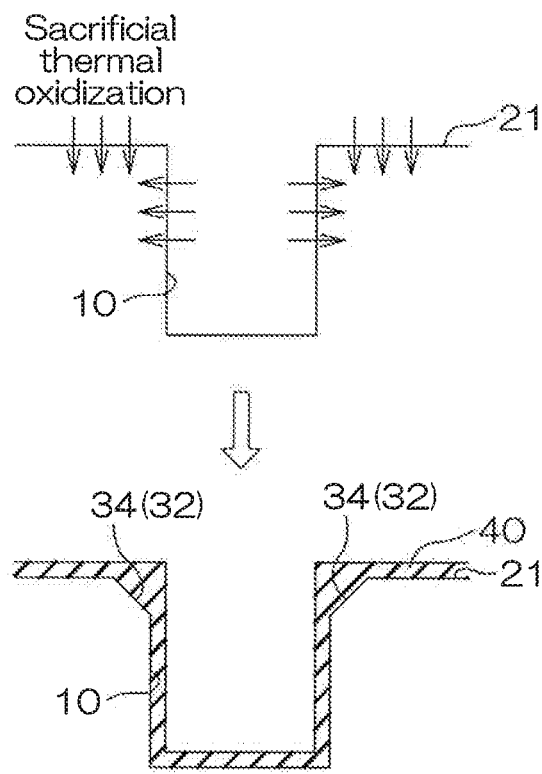
FIG. 5 is a drawing which describes a step of forming an inclined surface at an upper edge.

Here, as shown in FIG. 3, in a case where the inclined surface 34 is formed at the upper edge 32, after formation of the gate trench 9 and before formation of the gate insulating film 23, the SiC substrate 2 is thermally oxidized. Specifically, as shown in FIG. 5, a sacrificial oxide film 40 is formed by thermally oxidizing the SiC substrate 2. When the sacrificial oxide film 40 is formed, in the vicinity of the gate finger trench 10, oxidation is uniformly started from both the surface 21 of the SiC substrate 2 and the side surface of the gate finger trench 10. Thus, at the upper edge 32, an oxidation film which has progressed from the surface 21 of the SiC substrate 2 and an oxidation film which has progressed from the side surface of the gate finger trench 10 are integrated ahead of other regions. Thereby, the inclined surface 34 is to be formed below the oxidation film integrated through the above process. Thereafter, the sacrificial oxide film 40 may be removed to form the gate insulating film 23 by using a CVD method.

Figure 6:
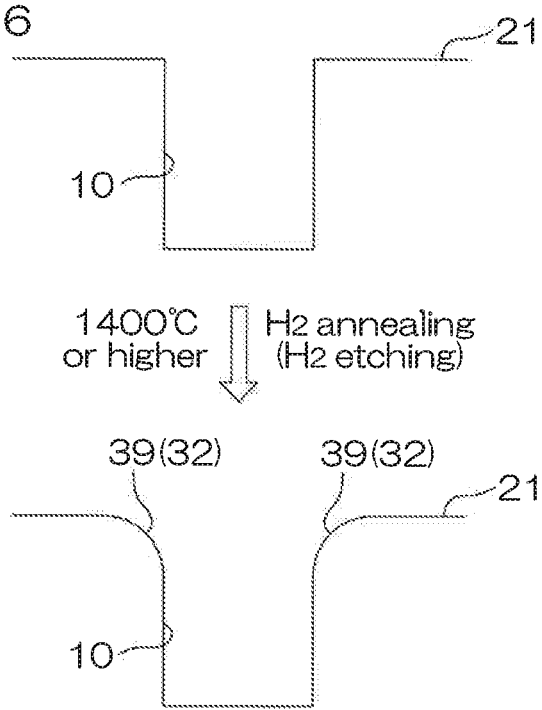
FIG. 6 is a drawing which describes a step of forming a circular surface at the upper edge.

On the other hand, in a case where the circular surface 39 is formed at the upper edge 32, after formation of the gate finger trench 10 and before formation of the gate insulating film 23, the SiC substrate 2 is treated by $H_2$ annealing. Specifically, as shown in FIG. 6, $H_2$ annealing ($H_2$ etching) is given to the SiC substrate 2 at temperatures higher than 1400° C., thereby the circular surface 39 is formed at the upper edge 32.

Returning to FIG. 4 again, after formation of the gate insulating film 23, the gate trench 9 and the gate finger trench 10 are backfilled and polysilicon is deposited until the gate trench 9 and the gate finger trench 10 are entirely hidden (Step S5). The thus deposited polysilicon is patterned, by which polysilicon outside the gate trench 9 is removed in the active portion 3 and at the same time polysilicon is allowed to remain as the overlap portion 24 in the gate finger portion 4. With this, the electrode film residue 50 composed of remaining polysilicon materials is formed at the source trench 47.

Next, the interlayer film 29 is formed on the SiC substrate 2 by using a CVD method (Step S6). Next, by patterning the interlayer film 29, the contact hole 30 and the contact hole 31 are formed at the same time (Step S7). With this, in the source trench 47, the gate insulating film 23 will partially remain as the insulating film residue 49 at a portion sandwiched between the electrode film residue 50 and an inner surface of the source trench 47.

Next, a metal material such as aluminum is deposited on the interlayer film 29 by using a sputtering method or a vapor deposition method (Step S8). Thereby, the source pad 5, the gate pad 7 and the gate finger 8 are formed. The semiconductor device 1 is obtained through the above steps, etc.

According to the semiconductor device 1, since the bottom portion p type region 38 is formed, it is possible to produce a depletion layer which is obtained by junction between the bottom portion p type region 38 and the n type drain region 20 (pn junction) in the vicinity of the gate finger trench 10. Then, the presence of the depletion layer makes it possible to keep an equipotential surface away from the gate insulating film 23. As a result, it is possible to alleviate an electric field applied to the gate insulating film 23 at the bottom portion of the gate finger trench 10. Further, the bottom portion p type region 38 of the gate finger portion 4 can be formed by the same step as that of the p type region 28 of the active portion 3, therefore it is also possible to simplify a step of manufacturing the semiconductor device 1.

In addition, since the pitch $P_2$ of the gate finger trench 10 is made narrower than the lattice pitch $P_1$ of the gate trench 9 (refer to FIG. 2B), the bottom portion p type region 38 can be increased in density at the gate finger portion 4. Thus, it is possible to alleviate electric field concentration at the gate finger portion 4 on application of high voltage and reduce occurrence of avalanche breakdown at the gate finger portion 4. As a result, avalanche breakdown is allowed to preferentially occur at the active portion 3, therefore it is possible to realize a high avalanche resistance.

According to experiment results of the inventors of the present application, for example, in the semiconductor device 1, the structure of which is shown in FIG. 1A to FIG. 3, it has been found that the pitch $P_2$ is made narrower to 2 μm from 6 μm, by which an electric field applied to the bottom portion of the gate finger trench 10 on application of high voltage can be alleviated approximately to 0.7 times. Thereby, it has been found that the semiconductor device 1 withstands an avalanche current about 8 times greater before the change in pitch.

In addition, a structure for alleviating the electric field of the gate finger portion 4 is the bottom portion p type region 38 which is formed at the bottom portion of the gate finger trench 10. Therefore, it is possible to easily form an electric field relaxation region which is deeper than the bottom portion of the gate finger trench 10 only by forming a p type impurity region relatively shallowly from the bottom portion of the gate finger trench 10.

Figure 14:
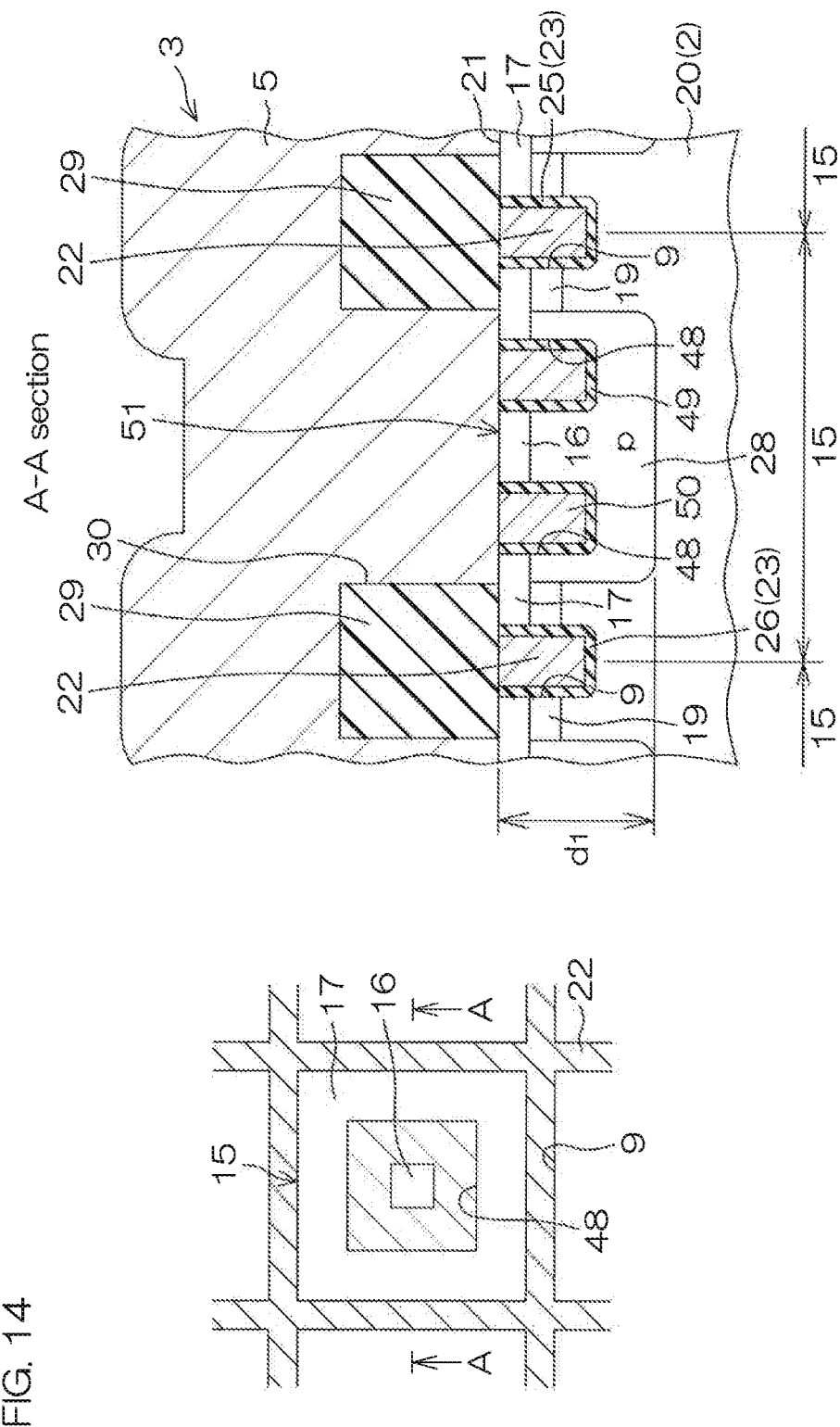
FIG. 14 is a cross-sectional view which describes a preferred embodiment of an active portion of the semiconductor device.
Figure 15:
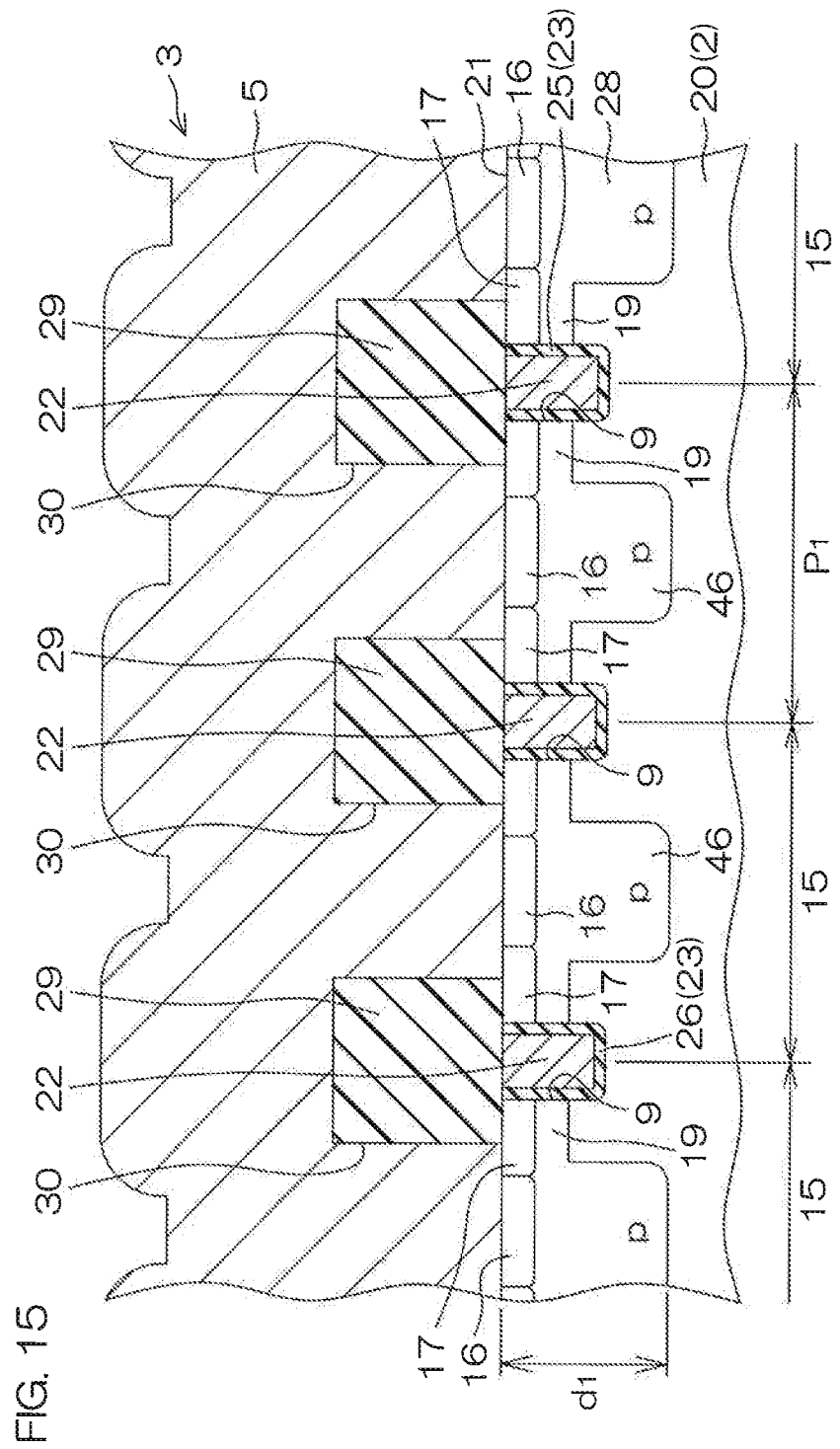
FIG. 15 is a drawing which describes a preferred embodiment of the active portion of the semiconductor device.

FIG. 7 to FIG. 13 are drawings for describing a preferred embodiment of the gate finger portion 4 of the semiconductor device 1. Further, FIG. 14 and FIG. 15 are drawings for describing a preferred embodiment of the active portion 3 of the semiconductor device 1.

Figure 7:
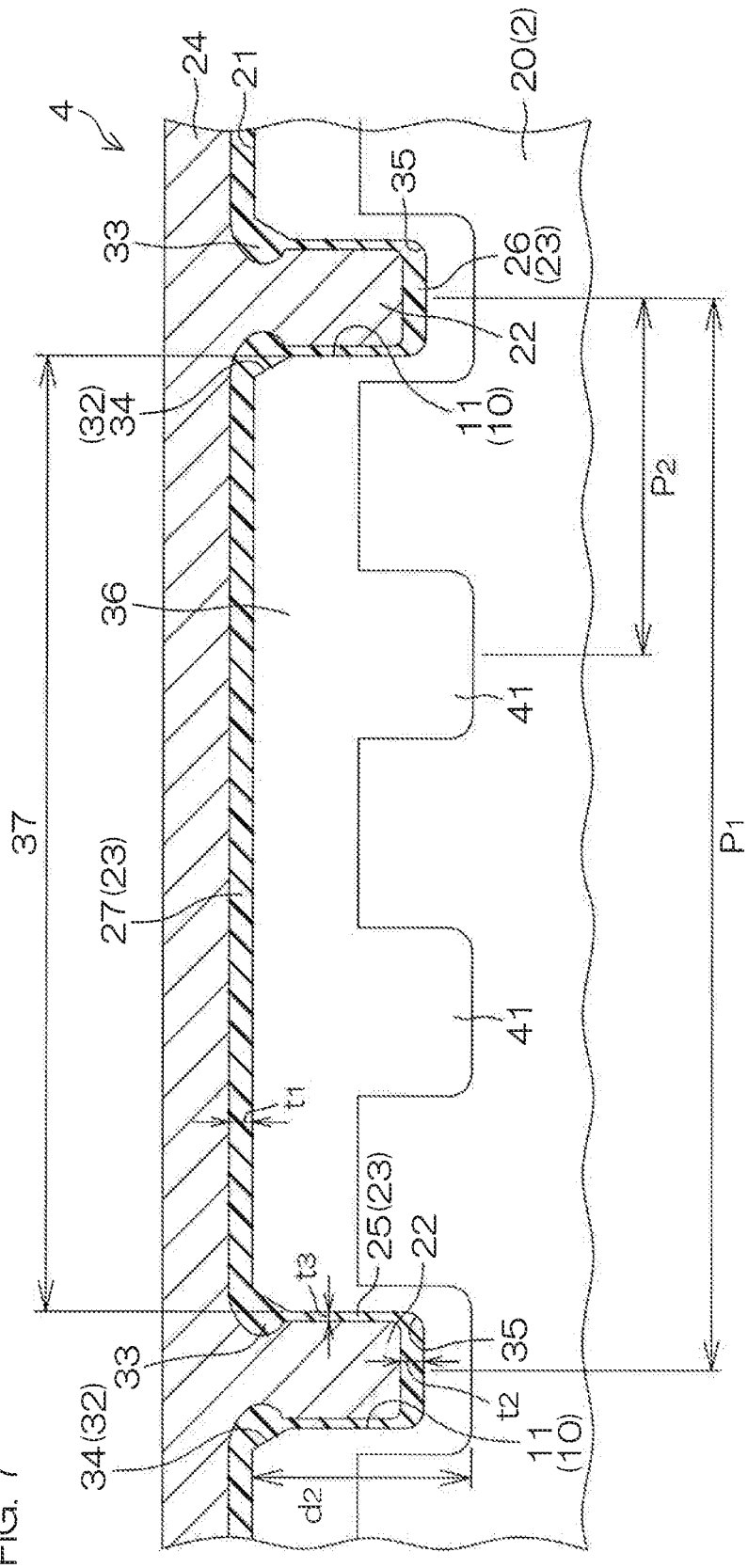
FIG. 7 is a cross-sectional view which describes a preferred embodiment of a gate finger portion of the semiconductor device.

As shown in FIG. 7, the semiconductor device 1 may not be provided with the second gate finger trench 12 between the first gate finger trenches 11. In this case, a region between the mutually adjacent first gate finger trenches 11 is formed as the flat region 37, and the p type region 36 is formed all over the entire flat region 37. In FIG. 7, a structure for alleviating the electric field of the gate finger portion 4 is formed as a p type protrusion region 41. The p type protrusion region 41 continues to the p type region 36 and selectively protrudes downward from the p type region 36. The protrusion position is, for example, a position at which the above-described second gate finger trench 12 is formed. The p type protrusion region 41 may be formed so as to be equal to the depth $d_2$ of the bottom portion p type region 38 of the first gate finger trench 11. Further, the p type protrusion region 41 may be formed in a stripe shape parallel to the first gate finger trench 11, as with the second gate finger trench 12, or may be formed in such a shape that selectively protrudes along a longitudinal direction of the first gate finger trench 11. It is noted that the p type protrusion region 41 may be formed by an ion implantation/annealing step for forming the p type region 28.

According to this arrangement, the pitch $P_2$ of the p type region which is deeper than the first gate finger trench 11 can be made narrower than the lattice pitch $P_1$ of the gate trench 9 at the gate finger portion 4. Thus, the bottom portion p type region 38 and the p type protrusion region 41 can be increased in density at the gate finger portion 4. Therefore, it is possible to alleviate electric field concentration at the gate finger portion 4 on application of high voltage and reduce the occurrence of avalanche breakdown at the gate finger portion 4. As a result, avalanche breakdown is allowed to preferentially occur at the active portion 3, therefore it is possible to realize a high avalanche resistance.

Further, the p type protrusion region 41 is formed at the flat region 37 of the SiC substrate 2. Thus, it is possible to form the p type protrusion region 41 at an intended depth position with a high probability, even on occurrence of positional deviation of the mask on ion implantation.

In a case where a p type impurity region is formed on the SiC substrate 2 by ion implantation, for example, the depth thereof is controlled by implanting energy. The greater the implanting energy increases, the deeper a position the p type impurity region can be formed from the surface 21 of the SiC substrate 2. The implanting energy is determined according to an intended depth position. Therefore, when a mask undergoes positional deviation at a stage prior to implantation, there is a case that no impurity region can be formed at the intended depth position. For example, as described above, energy conditions on formation of the bottom portion p type region 38 of the gate finger trench 10 will be determined according to a depth from a reference surface, with an implantation surface of ion (the bottom surface of the gate finger trench 10) given as the reference surface. However, if the mask deviates laterally in relation to the gate finger trench 10, the reference surface of the depth will move upward up to the surface 21 of the SiC substrate 2 (an opening end of the gate finger trench 10), and there is a possibility that the impurity region may be formed only at a shallower position than the intended position. However, according to this arrangement, since the p type protrusion region 41 is formed at the flat region 37, the reference surface of ion implantation is hardly changed in height position even on occurrence of positional deviation of the mask. Thus, the above effect can be obtained.

Figure 8:
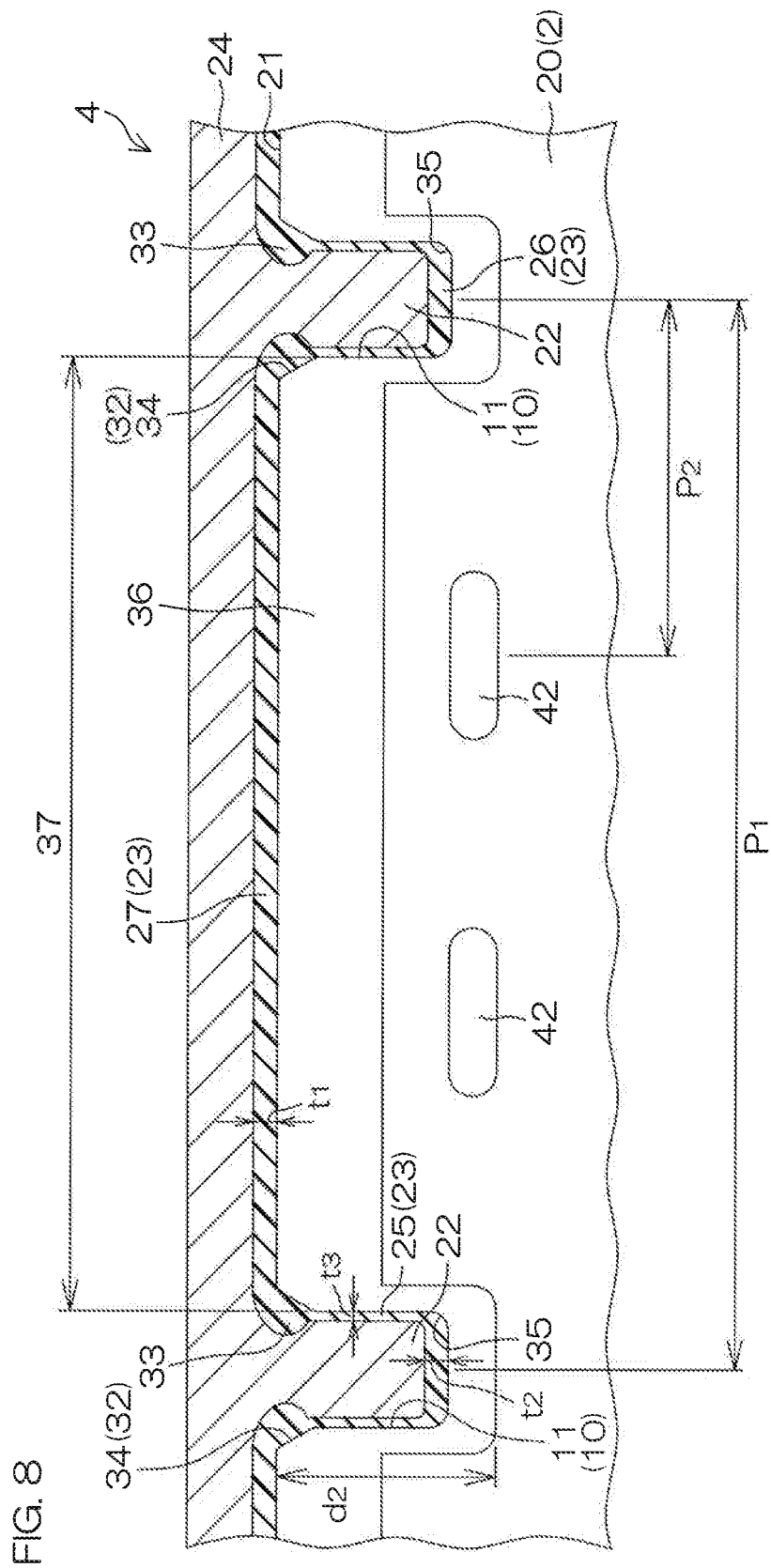
FIG. 8 is a cross-sectional view which describes a preferred embodiment of the gate finger portion of the semiconductor device.

Further, the semiconductor device 1 may be provided with a p type floating region 42 which is formed below the p type region 36, with a clearance kept, as shown in FIG. 8, in place of the p type protrusion region 41 of FIG. 7. A position at which the p type floating region 42 is formed is, for example, a position at which the above-described second gate finger trench 12 is formed. Still further, the p type floating region 42 may be in a stripe shape parallel to the first gate finger trench 11, as with the second gate finger trench 12, or may be selectively interspersed along a longitudinal direction of the first gate finger trench 11.

As shown in FIG. 9, the semiconductor device 1 may be provided with a p type region 43 which continues to an entire lower portion of the p type region 36. The p type region 43 is integrated with the bottom portion p type region 38 of the first gate finger trench 11 by continuing thereto in a lateral direction along the surface 21 of the SiC substrate 2. Further, the p type region 43 may be formed so as to be equal in depth $d_2$ to the bottom portion p type region 38 of the first gate finger trench 11. Thereby, at the flat region 37, a p type impurity region is formed continuously at a region deeper than the first gate finger trench 11 from one of the first gate finger trenches 11 to the other of the first gate finger trenches 11. That is, a region between the mutually adjacent first gate finger trenches 11 is entirely covered by the p type region deeper than the first gate finger trench 11. It is, therefore, possible to increase the density of the p type region at the gate finger portion 4.

As shown in FIG. 10, the semiconductor device 1 may be provided with an $n^+$ type region 44 inside the p type region 36. The $n^+$ type region 44 may be formed at the same depth position as the $n^+$ type source region 17 of the active portion 3 (refer to FIG. 2A).

Figure 11A:
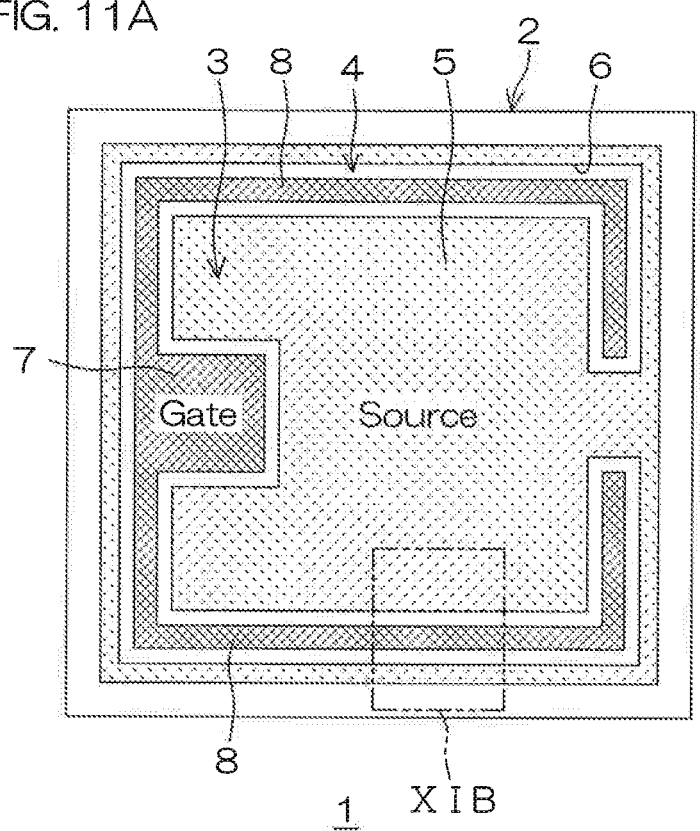
FIG. 11A is a plan view which describes a preferred embodiment of the gate finger portion of the semiconductor device.
Figure 11B:
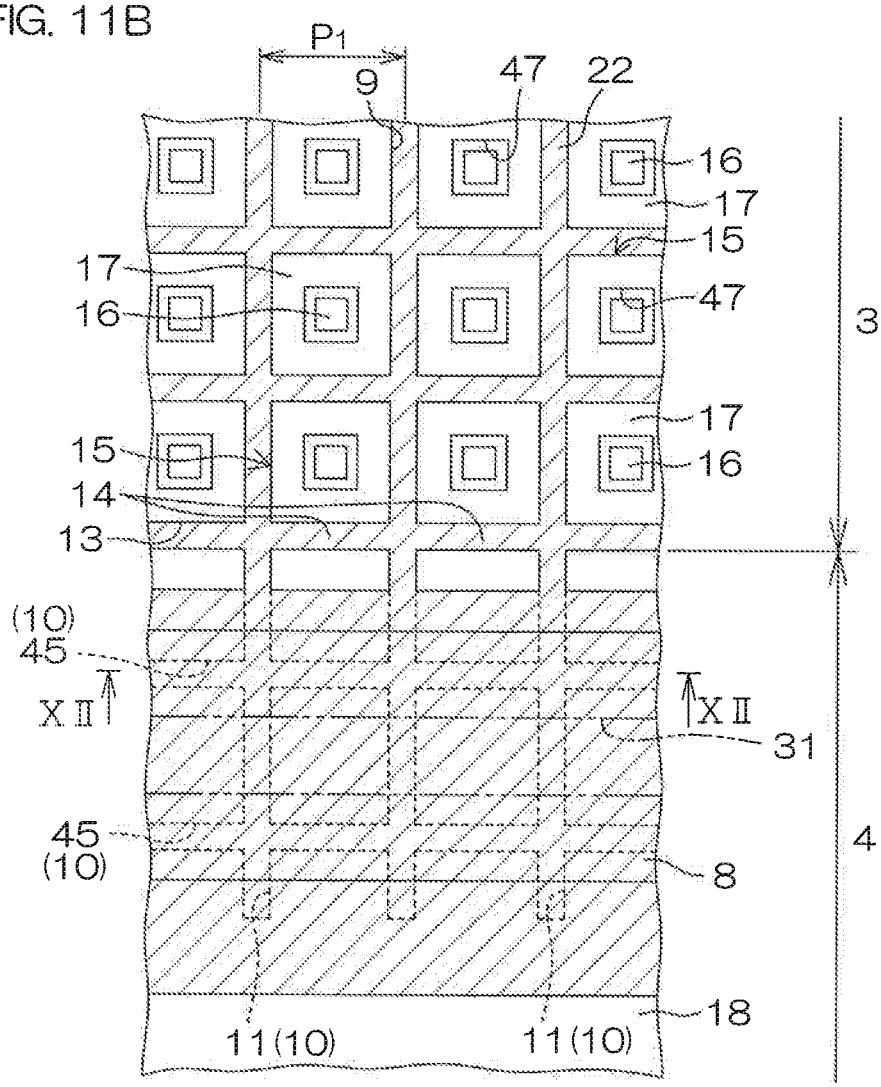
FIG. 11B is an enlarged view of a region enclosed with a double dotted and dashed line XIB in FIG. 11A.
Figure 12:
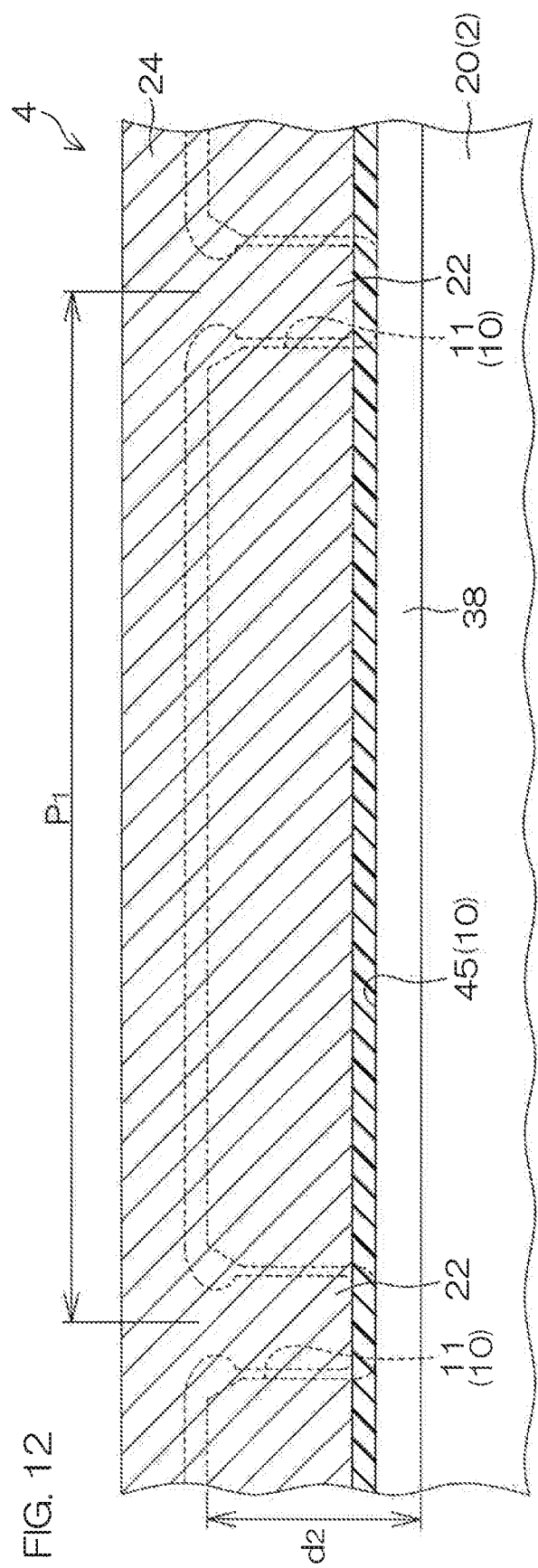
FIG. 12 is a cross-sectional view which describes a preferred embodiment of the gate finger portion of the semiconductor device.

As shown in FIG. 11A and FIG. 11B, the semiconductor device 1 may be provided with a second gate finger trench 45 extending in a direction intersecting with the first gate finger trench 11, in place of the second gate finger trench 12 parallel to the first gate finger trench 11. The plurality of second gate finger trenches 45 may be formed in a longitudinal direction of the first gate finger trench 11, with a clearance kept. Thereby, the gate finger trench 10 may be formed in a lattice shape as a whole by the first gate finger trenches 11 extending in one direction and the second gate finger trenches 45 extending in the other direction intersecting with the direction of the first gate finger trenches 11. Then, the bottom portion p type region 38 may be formed also at the second gate finger trench 45, as with the first gate finger trench 11 (refer to FIG. 3). Thereby, at a region along the second gate finger trench 45, as shown in FIG. 12, it is possible to form continuously a p type impurity region deeper than the first gate finger trench 11 from one of the first gate finger trenches 11 to the other of the first gate finger trenches 11.

Figure 13:
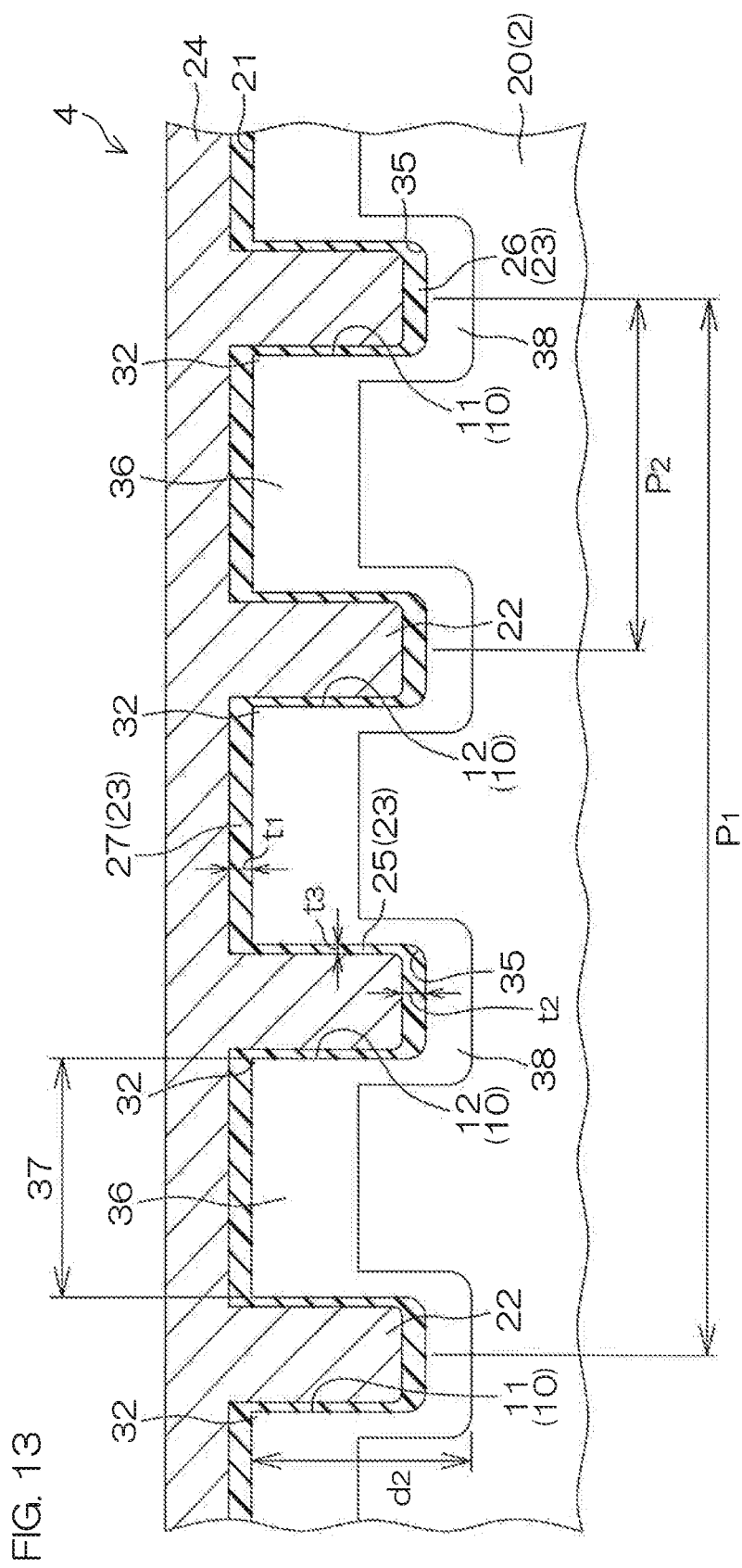
FIG. 13 is a cross-sectional view which describes a preferred embodiment of the gate finger portion of the semiconductor device.

As shown in FIG. 13, the semiconductor device 1 may not be provided with the inclined surface 34 or the circular surface 39 at the upper edge 32 of the gate finger trench 10. That is, the upper edge 32 may be pointed.

Further, as shown in FIG. 14, the semiconductor device 1 may be provided with a source trench 48 in place of the source trench 47. The source trench 48 is formed in such a shape that is partitioned by both sides of an outer circumference side and an inner circumference side in a plan view (the left-side drawing in FIG. 14). In this case, on a cut plane which appears when the SiC substrate 2 is cut in a depth direction thereof, as shown in a cross section taken along line A-A, two of the source trenches 48 appear (a second pattern of the source trench). Specifically, as shown in the left-side drawing of FIG. 14, the source trenches 48 may be in a (regular) quadrilateral annular shape, a (regular) hexagonal annular shape, a circular annular shape, etc., in a plan view. Thereby, a raised portion 51 (mesa portion) which is partitioned by an inner circumference side of the source trench 48 is formed in an internal region of the source trench 48. Further, the source trench 48 is equal in depth and width to the gate trench 9.

As with the arrangement shown in FIG. 2A, the p type region 28 is formed all over in an outer edge portion of the source trench 48 and in an internal region thereof. Therefore, the p type region 28 is provided with an external surface which extends from the p type channel region 19 along a side surface of the source trench 48 in a vertical direction and extends in a lateral direction along the bottom surface of the source trench 48 and also provided, below the raised portion 51, with an external surface which extends along the surface of the SiC substrate 2 in a lateral direction. Thereby, in the arrangement shown in FIG. 14, there is provided, below the raised portion 51, the p type region 28 which is formed more deeply than the source trench 48. In this preferred embodiment, the raised portion 51 is such that a major portion thereof excluding a surface portion is arranged by the p type region 28. The $p^+$ type channel contact region 16 may be formed all over in the surface portion of the raised portion 51.

Further, as shown in FIG. 15, the semiconductor device 1 may not be provided with the source trench 47 or 48. The $p^+$ type channel contact region 16 is formed at a central region of each unit cell 15, and the $n^+$ type source region 17 may be formed so as to surround the $p^+$ type channel contact region 16. In this case, the semiconductor device 1 may be provided with a p type pillar layer 46 (for example, concentrations of $1 \times 10^{16}$ cm$^{-3}$ to $1 \times 10^{19}$ cm$^{-3}$) which continues to the p type channel region 19. The p type pillar layer 46 is formed in a region inside the p type channel region 19 of each unit cell 15. More specifically, the p type pillar layer 46 may be formed in a shape similar to, for example, the p type channel region 19 (in a quadrilateral shape in a plan view in the layout of FIG. 1B) approximately in a central region of the p type channel region 19. That is, the p type pillar layer 46 is formed in an approximately pillar shape (in an approximately quadratic prism shape in the layout of FIG. 1B). Thereby, on the SiC substrate 2, the p type pillar layers 46 arrayed at a suitable pitch and the n type drain regions 20 sandwiched between the mutually adjacent p type pillar layers 46 are arrayed alternately in a direction along the surface 21.

Although the preferred embodiments of the present invention have been described as above, the present invention can be embodied in still other modes.

For example, such an arrangement may be adopted that a conductive type of each semiconductor portion of the above-described semiconductor device 1 is inverted. For example, in the semiconductor device 1, p type portions may be n type and n type portions may be p type.

Further, the semiconductor adopted in the semiconductor device 1 may not only be SiC but may be, for example, Si, GaN, diamond, etc.

Further, the overlap portion 24 may be formed not only in the gate finger portion 4 but also in the active portion 3. The overlap portion 24 may be formed also at the active portion 3, for example, by covering only a portion around the opening end of the gate trench 9 to such an extent that an upper surface of each unit cell 15 is not hidden. In this case, the overhung portion 33 is formed also at the gate trench 9, by which it is possible to obtain an effect of improving a withstand voltage similar to the above-described effect. That is, a structure directly below the gate finger 8 is only one example which shows an effect of improving a withstand voltage by the overhung portion 33 of the present invention and, the structure is not limited to the gate finger portion as long as the structure is capable of obtaining a similar effect.

Various other design changes may be made within the scope of the matters as set forth in the appended Claims.

This application corresponds to Japanese Patent Application No. 2015-66694 filed in the Japan Patent Office on Mar. 27, 2015, and the entire disclosure of which shall be incorporated herein by reference.

REFERENCE SIGNS LIST

1 Semiconductor device
2 SiC substrate
3 Active portion
4 Gate finger portion
8 Gate finger
9 Gate trench
10 Gate finger trench
11 First gate finger trench
12 Second gate finger trench
17 $n^+$ type source region
19 p type channel region
20 n type drain region
22 Gate electrode
23 Gate insulating film
24 Overlap portion
25 Side surface portion (of gate insulating film)
26 Bottom surface portion (of gate insulating film)
27 Surface portion (of gate insulating film)
28 p type region
32 Upper edge
33 Overhung portion
34 Inclined surface
35 Circular surface
36 p type region
37 Flat region
38 bottom portion p type region
39 Circular surface
41 p type protrusion region
42 p type floating region
43 p type region
45 Second gate finger trench
46 p type pillar layer

The invention claimed is:

1. A semiconductor device comprising:
a semiconductor layer of SiC which includes an active portion;
a plurality of MIS transistors which are formed at the active portion, the active portion partitioned into the plurality of MIS transistors by a plurality of gate trenches, and each of the MIS transistors having a first conductive-type source region, a second conductive-type channel region, and a first conductive-type drain region sequentially along a side surface of the gate trench;
a plurality of first gate finger trenches that are arranged as extended portions of the gate trenches at a gate finger portion;
a gate electrode embedded in each of the gate trenches and the first gate finger trenches via a gate insulating film;
a second conductive-type first bottom-portion impurity region which is formed at least at a bottom portion of the first gate finger trenches and at least a part of a bottom of the second conductive-type first bottom-portion impurity region is formed to become the same depth so as to define a horizontal straight line in a cross sectional view;

a gate conductive layer that is electrically connected to the first gate finger trenches and the gate electrode;

a source electrode formed over the semiconductor layer;

a second conductive-type contact region formed between two adjacent gate trenches such that the second conductive-type contact region is in contact with the second conductive-type channel region, the second conductive-type contact region having a higher impurity concentration than the second conductive-type channel region;

a second contact region being in contact with the second conductivity-type contact region, the second contact region having a different impurity concentration from the second conductive-type contact region;

a first film formed on the semiconductor layer, the first film being formed between two adjacent gate trenches such that the first film straddles a boundary between the second conductive-type contact region and the second contact region, and the first film including a non-conductive material; and a first conductive film formed between the source electrode and the first film such that a layered structure of the first film and the first conductive film straddles the boundary between the second conductive-type contact region and the second contact region;

wherein the source electrode has a protruding portion that protrudes in a thickness direction of the semiconductor layer and is bounded by the first conductive film in a direction that crosses the thickness direction.

2. The semiconductor device according to claim 1, wherein the gate electrode embedded in the first gate finger trench has a projection portion projected to the opposite side of the bottom portion of the first gate finger trenches.

3. The semiconductor device according to claim 2, wherein the projection portion has a first portion formed directly over each of the first gate finger trenches and a second portion formed on a surface of the semiconductor layer which is sandwiched between the adjacent first gate finger trenches.

4. The semiconductor device according to claim 3, wherein the gate conductive layer is in direct contact with the first portion and the second portion of the projection portion.

5. The semiconductor device according to claim 4, wherein the projection portion has an upper surface across the first portion and the second portion of the projection portion, and the upper surface of the projection portion is approximately parallel to the bottom of the second conductive-type first bottom-portion impurity region.

6. The semiconductor device according to claim 1, which additionally comprises a plurality of second gate finger trenches, each of which is formed between an adjacent pair of the first gate finger trenches and being integral with the gate trench, and a second conductive-type second bottom-portion impurity region formed at least at a bottom portion of the second gate finger trenches.

7. The semiconductor device according to claim 6, wherein a part of a bottom of the second conductive-type second bottom-portion impurity region defines a part of the horizontal straight line in a cross sectional view.

8. The semiconductor device according to claim 7, wherein the second gate finger trenches extend along the first gate finger trenches.

9. The semiconductor device according to claim 7, wherein the second gate finger trenches extend in a direction which intersects with the first gate finger trenches.

10. The semiconductor device according to claim 1, wherein a region between an adjacent pair of the first gate finger trenches includes a flat region in which a surface of the semiconductor layer continues from a first of the first gate finger trenches to a second of the first gate finger trenches, the region additionally includes a second conductive-type surface-portion impurity region in the flat region.

11. The semiconductor device according to claim 10, wherein the second conductive-type first bottom-portion impurity region includes a region formed so as to continue to the second conductive-type surface-portion impurity region.

12. The semiconductor device according to claim 11, wherein the semiconductor layer is composed of a wide band gap semiconductor.

13. The semiconductor device according to claim 12, wherein the second conductive-type impurity region is formed more deeply than the second conductive-type first bottom-portion impurity region.

14. The semiconductor device according to claim 13, wherein a lower edge of a trench in which the gate electrode is embedded includes a circular surface that allows the side surface of the trench to continue to the bottom surface thereof.

15. The semiconductor device according to claim 14, wherein the gate electrode is provided with an overlap portion that overlaps with the surface of the semiconductor layer at an upper edge of the trench, and the gate insulating film includes an overhung portion that protrudes inside the trench at the upper edge.

16. The semiconductor device according to claim 15, wherein the upper edge includes an inclined surface that allows the surface of the semiconductor layer to continue to an inner surface of the trench.

17. The semiconductor device according to claim 15, wherein the upper edge includes a circular surface that allows the surface of the semiconductor layer to continue to the inner surface of the trench.

18. The semiconductor device according to claim 15, wherein the gate insulating film on the bottom surface of the trench is thicker than the gate insulating film on the side surface of the trench.

19. The semiconductor device according to claim 15, wherein the gate insulating film additionally includes a portion on the surface of the semiconductor layer that is thicker than the gate insulating film on the side surface of the trench.

20. The semiconductor device according to claim 14, wherein avalanche breakdown preferentially occurs at the active portion rather than the gate finger portion.

* * * * *